United States Patent
Ota et al.

(10) Patent No.: US 7,202,488 B2
(45) Date of Patent: Apr. 10, 2007

(54) CORRECTION SYSTEM, METHOD OF CORRECTING DEFLECTION DISTORTION, PROGRAM AND METHOD FOR MANUFACTURING A SEMICONDUCTOR DEVICE

(75) Inventors: Takumi Ota, Kawasaki (JP); Tetsuro Nakasugi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 412 days.

(21) Appl. No.: 10/948,555

(22) Filed: Sep. 24, 2004

(65) Prior Publication Data

US 2005/0088099 A1 Apr. 28, 2005

(30) Foreign Application Priority Data

Sep. 30, 2003 (JP) ............ P2003-342369

(51) Int. Cl.
- H01J 37/302 (2006.01)
- H01J 37/30 (2006.01)
- G03C 5/00 (2006.01)

(52) U.S. Cl. ............ 250/492.22; 250/492.23; 250/492.2; 250/491.1; 430/30; 430/296; 315/371

(58) Field of Classification Search ............ 250/492.2, 250/492.22, 492.23, 491.1; 430/30
See application file for complete search history.

(56) References Cited

U.S. PATENT DOCUMENTS

| | | | | |
|---|---|---|---|---|
| 4,789,945 A | * | 12/1988 | Niijima | 430/30 |
| 5,689,117 A | * | 11/1997 | Nakasuji | 250/492.23 |
| 5,770,863 A | * | 6/1998 | Nakasuji | 250/492.2 |
| 6,027,841 A | * | 2/2000 | Suzuki | 430/30 |
| 6,027,843 A | * | 2/2000 | Kojima et al. | 430/30 |
| 6,180,947 B1 | * | 1/2001 | Stickel et al. | 250/396 ML |
| 6,222,197 B1 | * | 4/2001 | Kojima | 250/492.22 |
| 6,541,169 B1 | * | 4/2003 | Okino et al. | 430/30 |
| 6,580,075 B2 | * | 6/2003 | Kametani et al. | 250/310 |
| 2001/0045805 A1 | * | 11/2001 | Shibata | 315/371 |
| 2006/0076508 A1 | * | 4/2006 | Nakasugi et al. | 250/491.1 |

FOREIGN PATENT DOCUMENTS

| | | |
|---|---|---|
| JP | 7-111943 | 11/1995 |
| JP | 11-307424 | 11/1999 |
| JP | 3388066 | 1/2003 |

* cited by examiner

Primary Examiner—Nikita Wells
Assistant Examiner—Johnnie L Smith, II
(74) Attorney, Agent, or Firm—Finnegan, Henderson, Farabow, Garrett & Dunner, L.L.P.

(57) ABSTRACT

A method of correcting deflection distortion includes dividing a deflection area to which a charged-particle beam is deflected into equal initial blocks as an initial setting, calculating an initial aberration amount for each of the initial blocks generated when the charged-particle beam is deflected, dividing the deflection area into main blocks in accordance with a change rate of the initial aberration amount; calculating a main aberration amount for each of the main blocks generated when the charged-particle beam is deflected, and calculating a correction value correcting a deflection distortion based on the main aberration amount.

20 Claims, 16 Drawing Sheets

CORRECTION SYSTEM, METHOD OF CORRECTING DEFLECTION DISTORTION, PROGRAM AND METHOD FOR MANUFACTURING A SEMICONDUCTOR DEVICE

CROSS REFERENCE TO RELATED APPLICATIONS

This application is based upon and claims the benefit of priority from the prior Japanese Patent Applications No. P2003-342369, filed on Sep. 30, 2003; the entire contents of which are incorporated herein by reference.

BACKGROUND OF THE INVENTION

1. Field of the Invention

The present invention relates to a charged-particle beam drawing tool, and, more particularly, relates to a correction system, a correction method, a program for correcting a deflection distortion by a deflector and a method for manufacturing a semiconductor device.

2. Description of the Related Art

As integrated circuits have become finer and have higher density, charged-particle beam drawing tools using a charged-particle beam, such as an electron beam (EB) or a focused ion beam (FIB), are becoming more important. A charged-particle beam drawing tool, as a semiconductor manufacturing device, is required to achieve stable operation, a high rate of throughput, and a fine-processing capability. However, there is a limit to the precision with which parts constituting the charged-particle beam drawing tool are processed and assembled. Accordingly, a deflection distortion may be caused by a deflector for deflecting a charged-particle beam. When a charged-particle beam is deflected, there are some cases where the deflection distortion causes an aberration between a position which is actually illuminated by the charged-particle beam and a position expected to be illuminated at a design stage. In order to direct a charged-particle beam with high accuracy, it is important to correct the deflection distortion due to the deflector.

As a correction method in a charged-particle beam drawing tool, a method is employed in which a correction value for correcting the deflection distortion is calculated, and a deflection voltage equivalent to the correction value is fed back to a deflector. As a method of calculating the correction value, for example, a deflection area on a stage to which a charged-particle beam is deflected is virtually divided into equal blocks in a matrix. A correction coefficient of a correction formula for correcting a deflection distortion is calculated for each of the equal blocks, and a correction value is calculated based on the correction formula using the correction coefficients.

However, the distribution of an electrical field or a magnetic field formed by a deflector is likely to become less even as the field is farther from an optical axis of the deflector. Accordingly, deflection distortion has a tendency to increase as a charged-particle beam becomes farther from the optical axis. The method in which the deflection area is equally divided results in the correction accuracy being decreased as the deflection area becomes farther from the optical axis. In this connection, a method in which a deflection area is virtually divided into equal small blocks can be also considered in order to achieve high accuracy, even at a position far from an optical axis. However, the method in which the deflection area is divided into equal small blocks requires an enormous amount of time to provide a correction for each of the equal small deflection blocks. As a result, the throughput decreases. That is, there is a trade-off relation between the accuracy with which the deflection distortion is corrected and the time required to correct the deflection distortion.

SUMMARY OF THE INVENTION

A feature of the present invention inheres in a method of correcting deflection distortion including dividing a deflection area to which a charged-particle beam is deflected into equal initial blocks as an initial setting, calculating an initial aberration amount for each of the initial blocks generated when the charged-particle beam is deflected: dividing the deflection area into main blocks in accordance with a change rate of the initial aberration amount, calculating a main aberration amount for each of the main blocks generated when the charged-particle beam is deflected, and calculating a correction value correcting a deflection distortion based on the main aberration amount.

Another feature of the present invention inheres in a correction system including an initial division unit configured to divide a deflection area to which a charged-particle beam is deflected into equal initial blocks as an initial setting, an initial aberration calculation unit configured to calculate a initial aberration amount for each of the initial blocks generated when the charged-particle beam is deflected, a main division unit configured to divide the deflection area into main blocks in accordance with a change rate of the initial aberration amount, a main aberration calculation unit configured to calculate a main aberration amount for each of the main blocks generated when the charged-particle beam is deflected, and a correction unit configured to calculate a correction value correcting a deflection distortion based on the main aberration amount.

An additional feature of the present invention inheres in a program for executing an application on a correction system. The program includes instructions for dividing a deflection area to which a charged-particle beam is deflected into initial blocks as an initial setting, instructions for calculating an initial aberration amount for each of the initial blocks generated when the charged-particle beam is deflected, instructions for dividing the deflection area into main blocks in accordance with a change rate of the initial aberration amount, instructions for calculating a main aberration amount for each of the main blocks generated when the charged-particle beam is deflected, and instructions for calculating a correction value correcting a deflection distortion based on the main aberration amount.

Further additional features of the present invention inhere in a method for manufacturing a semiconductor device comprising generating layout data of a device pattern for each layer of the semiconductor device corresponding to stages in a manufacturing process, preparing a set of masks for each layers of the semiconductor device, each of masks dividing the deflection area to which a charged-particle beam is deflected into initial blocks as an initial setting, calculating an initial aberration amount for each of the initial blocks generated when the charged-particle beam is deflected, dividing the deflection area into main blocks in accordance with a change rate of the initial aberration amount, calculating a main aberration amount for each of the main blocks generated when the charged-particle beam is deflected, calculating a correction value correcting a deflection distortion based on the main aberration amount, and delineating masks corresponding to the stages, respectively, by deflecting the charged-particle beam using the correction value based on the layout data in a charged-particle beam drawing tool; coating a resist film on a semiconductor wafer; delineating an etching mask by exposing a device pattern of one of a mask in the set of masks to the resist film; and processing the semiconductor wafer using the etching mask.

DETAILED DESCRIPTION OF THE INVENTION

Figure 1:
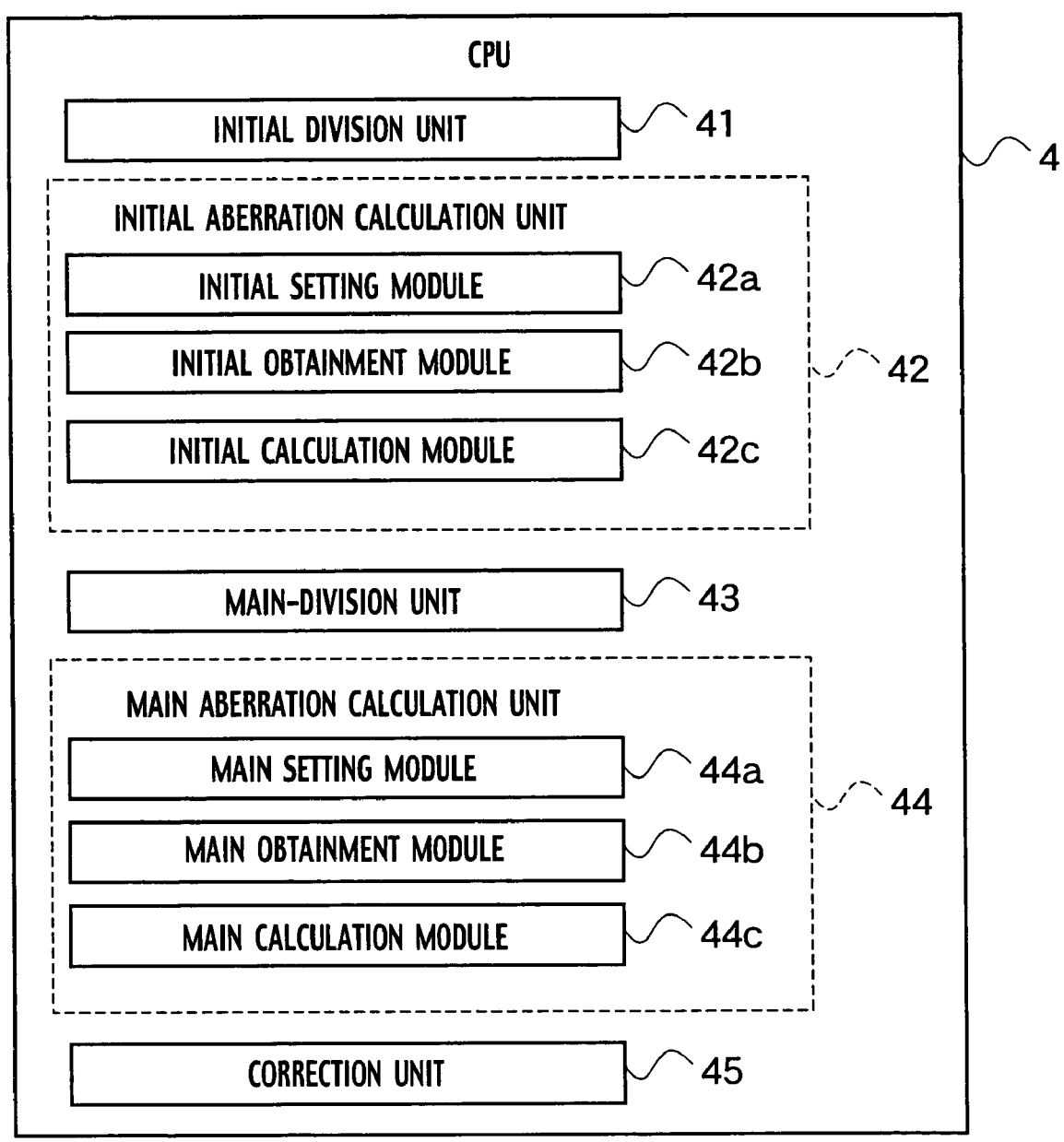
FIG. 1 is a block diagram showing an example of a central processing unit (CPU) according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the embodiments of the present invention, description will be given taking "an electron beam" as an example of "a charged-particle beam". However, "an ion beam" may be employed as the charged-particle beam. That is, the description below can be applied to the case of the ion beam as in the case of the electron beam.

As shown in FIG. 1, a central processing unit (CPU) 4 of a correction system according to an embodiment of the present invention includes: an initial division unit 41 dividing a deflection area to which an electron beam is deflected into a plurality of equal initial blocks as an initial setting; an initial aberration calculation unit 42 calculating an initial aberration amount for each of the plurality of initial blocks generated when the electron beam is deflected; a main division unit 43 dividing the deflection area into a plurality of main blocks in accordance with a change rate of the initial aberration amounts; a main aberration calculation unit 44 calculating a main aberration amount for each of the plurality of main blocks generated when the electron beam is deflected; and a correction unit 45 calculating correction values for correcting a deflection distortion based on the main aberration amounts. The CPU 4 shown in FIG. 1 is included in a charged-particle beam drawing tool (electron beam drawing tool) as shown in FIG. 2.

Figure 2:
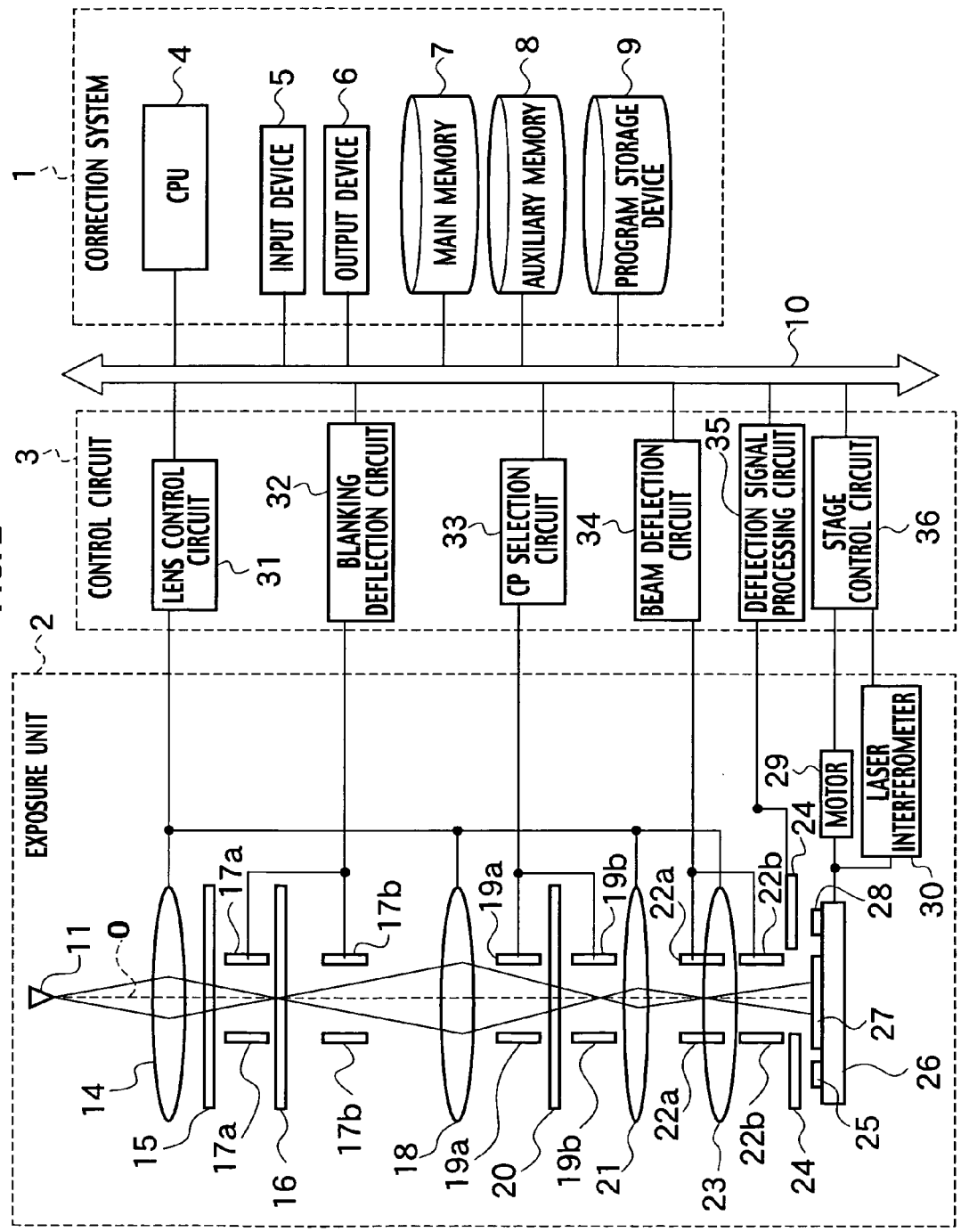
FIG. 2 is a block diagram showing an example of a charged-particle beam drawing tool (an electron beam drawing tool) according to the embodiment of the present invention.

As shown in FIG. 2, a charged-particle beam drawing tool (electron beam drawing tool) according to an embodiment of the present invention includes a correction system 1, an exposure unit 2, and a control circuit 3. The correction system 1 and the control circuit 3 are connected to each other through a bus 10. The exposure unit 2 includes an electron gun 11, a condenser lens 14, first and second shaping apertures 15 and 20, a blanking aperture 16, blanking deflectors 17a and 17b, a projection lens 18, character projection (CP) selection deflectors 19a and 19b, a demagnification lens 21, an objective lens 23, objective deflectors 22a and 22b, a detector 24, a mark mount 25 for measuring the position and the dimension of an electron beam, a stage 26 movable in X and Y directions, and a Faraday cup 28 for detecting an electron beam.

The electron gun 11 generates an electron beam. The condenser lens 14 adjusts illumination conditions of the electron beam. The first and second shaping apertures 15 and 20 form the electron beam into a desired shape. The blanking aperture 16 turns on/off the electron beam. The blanking deflectors 17a and 17b deflect the electron beam onto the blanking aperture 16. The projection lens 18 forms an image plane on the second shaping aperture 20. For the CP selection deflectors 19a and 19b, and the objective deflectors 22a and 22b, for example, coils and electrostatic deflectors can be used. The CP selection deflectors 19a and 19b control the degree of optical superposition by the first and second shaping apertures 15 and 20 by selecting a pattern (character) which the first and second shaping aperture 15 and 20 has. Each of the objective deflectors 22a and 22b has a main deflector and a sub-deflector to achieve highly accurate deflection without decreasing the throughput, and has a plurality of deflection electrodes to minimize deflection errors. The objective deflectors 22a and 22b control a main illumination position on the mark mount 25 or a sample 27 by deflecting the electron beam. The demagnification lens 21 and the objective lens 23 allow the electron beam to form an image on the mark mount (reference chip) 25 or the sample 27.

Figure 3A:
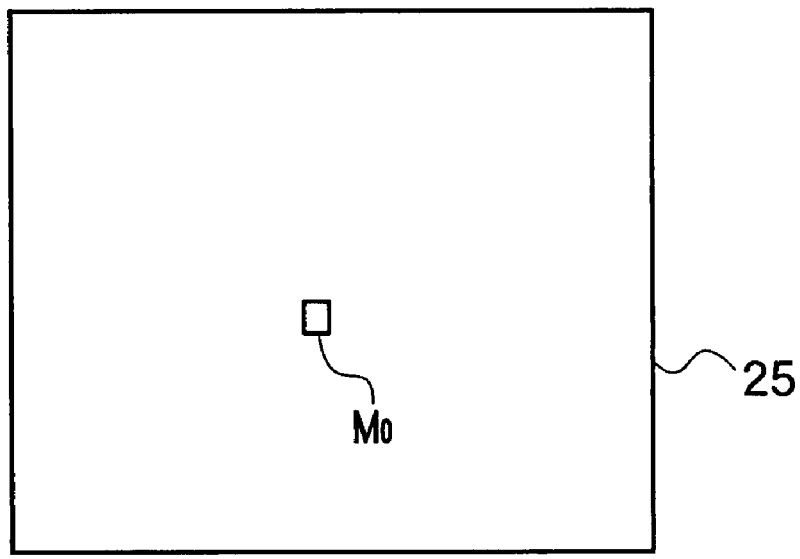
FIGS. 3A and 3B are plan views showing examples of a mark mount according to the embodiment of the present invention.
Figure 3B:
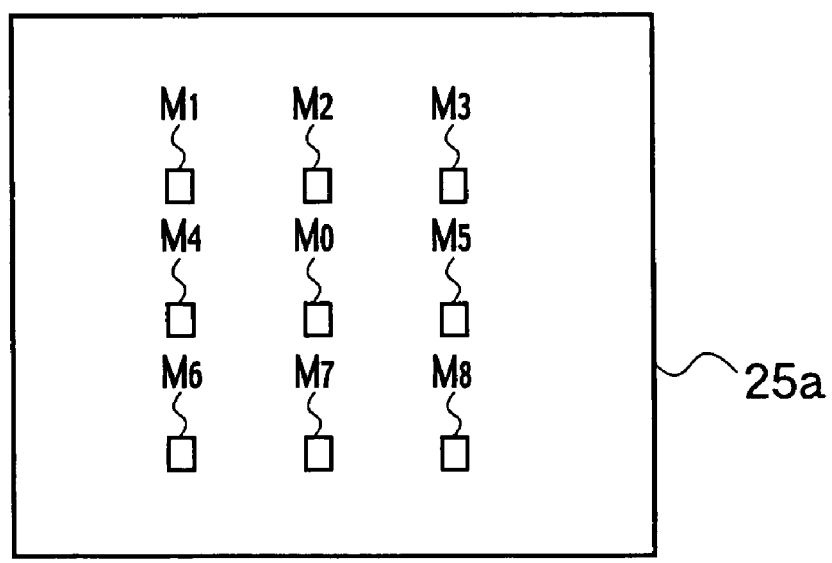
Figure 4:
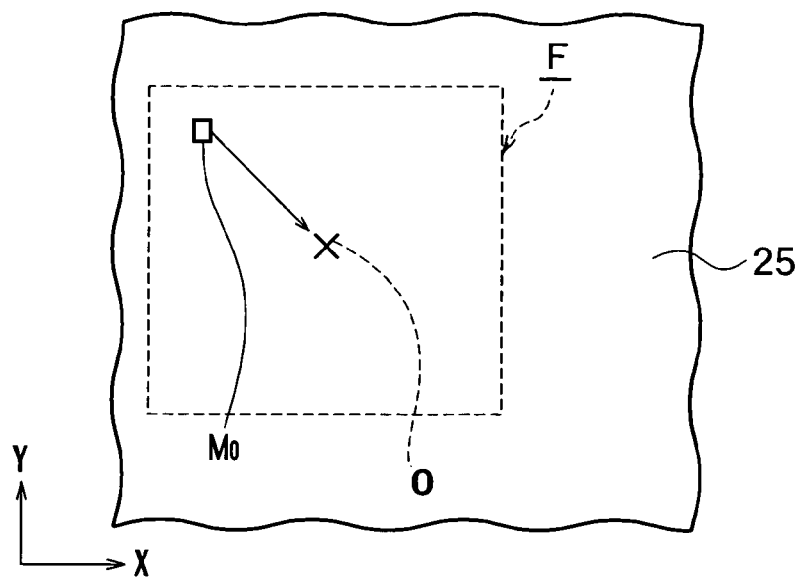
FIG. 4 is a schematic view for explaining moving a stage according to the embodiment of the present invention.

For the sample 27 to be placed on the stage 26, a semiconductor substrate, or the like, made of silicone (Si) or the like and coated with a resist film, can be used when a semiconductor device is manufactured. When an exposure mask is fabricated, a glass plate, or the like, coated with a resist film can be used. The detector 24 detects backscattered electrons or secondary electrons from the mark mount 25 and the sample 27. A position detection mark $M_0$ is arranged on the mark mount 25, as shown in FIG. 3A for example. At least one mark is sufficient to be arranged on the mark mount 25. As shown in FIG. 3B, a mark mount 25a may also be used on which a plurality of position detection marks $M_0$ to $M_8$ are arranged. Moreover, a position detection mark may also be arranged on the stage 26 shown in FIG. 1. Any of the sample 27, the Faraday cup 28 and the mark mount 25 on the stage 26 can be selected by moving the stage 26 in the X and Y directions. By moving the stage 26, the position detection mark $M_0$ on the mark mount 25 can be aligned with the center of a deflection area F to which an electron beam is deflected and directed, as shown in FIG. 4. The deflection area F is defined as a rectangular region on the basis of an optical axis O of the objective deflectors 22a and 22b.

The control circuit 3 shown in FIG. 2 includes a lens control circuit 31, a blanking deflection circuit 32, a CP selection circuit 33, a beam deflection circuit 34, a detection signal processing circuit 35, and a stage control circuit 36. The lens control circuit 31 applies a voltage to the condenser lens (lens holder) 14 so as to adjust the illumination conditions of the electron beam, to the condenser lens 14. The blanking deflection circuit 32 applies a deflection voltage to the blanking deflectors 17a and 17b so that the blanking deflectors 17a and 17b turn on/off the electron beam. The CP selection circuit 33 applies voltage to the CP selection deflectors 19a and 19b so that the CP selection deflectors 19a and 19b control the superposition of the electron beam. The beam deflection circuit 34 applies a deflection voltage to the objective deflectors 22a and 22b so that the objective deflectors 22a and 22b deflect the electron beam. The detection signal processing circuit 35 converts the back-scattered electrons or secondary electrons detected by the detector 24 to an electrical signal and transmits the electrical signal to the CPU 4. A motor 29 and a laser interferometer 30 are individually connected to the stage control circuit 36. The stage control circuit 36 controls the position of the stage 26 by driving the motor 29 based on the position of the coordinates of the stage 26 measured by the laser interferometer 30.

In the exposure unit 2, the current density of an electron beam generated by the electron gun 11 is adjusted to a desired density by the condenser lens 14, and the first shaping aperture 15 is evenly illuminated by the electron beam. The electron beam passing through the first shaping aperture 15 is then directed onto the second shaping aperture 20 by the projection lens 18. The electron beam formed by the optical superposition by the first and second shaping apertures 15 and 20 forms an image on the sample 27 through the demagnification lens 21 and the objective lens 23. The objective deflectors 22a and 22b form an electrical field in accordance with a deflection voltage applied by the beam deflection circuit 34, whereby the electron beam is deflected. When moving the sample 27, the electron beam is deflected to the blanking aperture 16 using the blanking deflectors 17a and 17b so that an inappropriate part of the sample 27 will not be exposed to light. Accordingly, the electron beam is prevented from being exposed to the surface of the sample 27.

Here, when the electron beam is deflected using the electron beam drawing tool, there are some cases where the actual position illuminated by the electron beam does not coincide with a desired position which was expected to be illuminated during a design stage (hereinafter, simply referred to as "desired illumination position"), due to deflection distortion attributable to the deflectors, e.g., distortion due to shift, magnification, rotation, high-order distortion, and the like. The aberration between an actual illumination position and a desired illumination position is corrected by the following correction equations (1) and (2), using correction values $(X_0, Y_0)$, the coordinates $(X, Y)$ of the desired illumination position, and correction coefficients $a_0$ to $a_9$ and $b_0$ to $b_9$.

$$X_0 = a_0 + a_1 x + a_2 y + a_3 xy + a_4 x^2 + a_5 y^2 + a_6 x^3 + a_7 y^3 + a_8 x^2 y + a_9 xy^2 \quad (1)$$

$$Y_0 = b_0 + b_1 x + b_2 y + b_3 xy + b_4 x^2 + b_5 y^2 + b_6 x^3 + b_7 y^3 + b_8 x^2 y + b_9 xy^2 \quad (2)$$

Here, the correction coefficients $a_0$ and $b_0$ are off-set values; the correction coefficients $a_1$ and $b_2$ are values for correcting magnification; the correction coefficients $a_2$ and $b_1$ are values for correcting rotation; and the correction values $a_3$ to $a_9$ and $b_3$ to $b_9$ are values for correcting high-order distortion. When an electron beam is deflected, the coordinates of a desired illumination position are substituted for X and Y in the right sides of the correction equations (1) and (2), and the correction values $(X_0, Y_0)$ are calculated using the correction coefficients $a_0$ to $a_9$ and $b_0$ to $b_9$ which are predetermined. A deflection distortion is corrected by applying a deflection voltage to the deflectors equivalent to the correction values $(X_0, Y_0)$. However, when the values of the predetermined correction coefficients $a_0$ to $a_9$ and $b_0$ to $b_9$ are inaccurate, suitable correction values $(X_0, Y_0)$ cannot be obtained in some cases. In order to correct a deflection distortion with high accuracy, it is important to calculate suitable values for the correction values $(X_0, Y_0)$.

Figure 5:
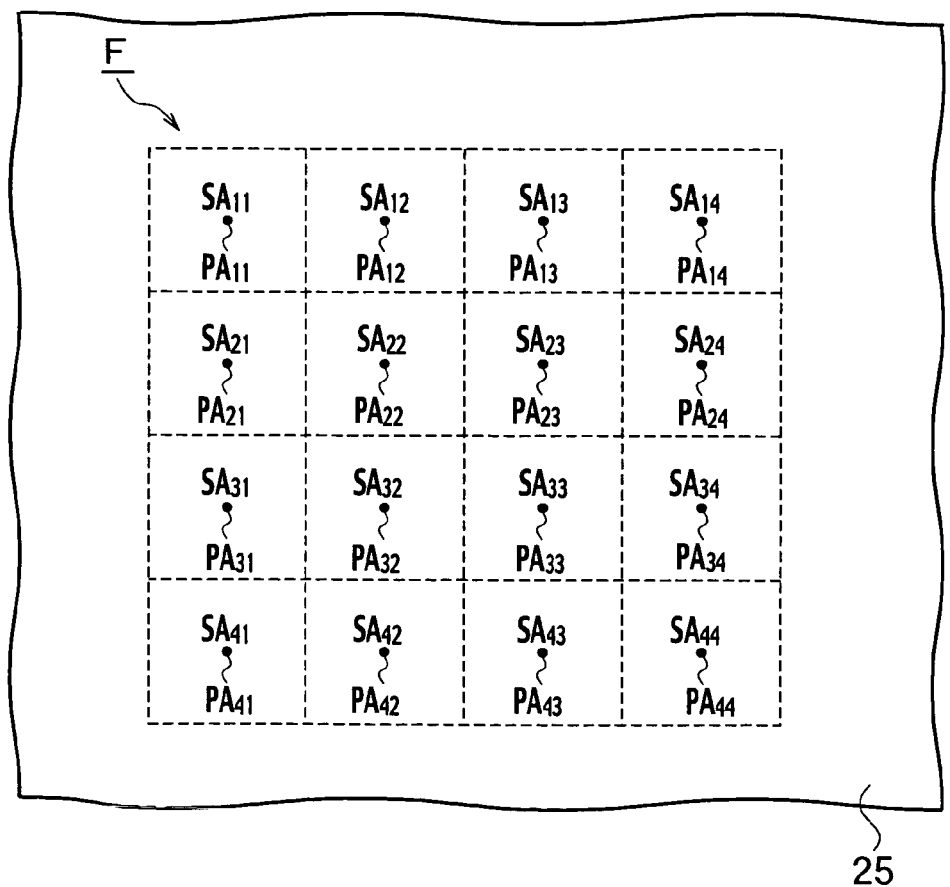
FIG. 5 is a schematic view showing an example of a plurality of initial blocks into which the deflection area is divided according to the embodiment of the present invention.

The correction system 1 includes the CPU 4, an input device 5, an output device 6, a main memory 7, an auxiliary memory 8, and a program storage device 9. As shown in FIG. 5 for example, the initial division unit 41 of the CPU 4 virtually divides the deflection area F (an outermost frame indicated by dotted lines), to which an electron beam is deflected, on the mark mount 25 into a plurality of equal initial blocks $SA_{ij}$ (i=1 to 4, j=1 to 4).

The initial aberration calculation unit 42 shown in FIG. 1 includes an initial setting module 42a, an initial obtainment module 42b and an initial calculation module 42c. As shown in FIG. 5 for example, the initial setting module 42a sets initial target positions $PA_{kl}$ (k=1 to 4, l=1 to 4), which are defined inside the plurality of initial blocks $SA_{ij}$, respectively for the plurality of initial blocks $SA_{ij}$. The initial target positions $PA_{kl}$ are set, for example, at the centers of the respective initial blocks $SA_{ij}$. Alternatively, the initial target positions $PA_{kl}$ may be set at the grid positions of the plurality of initial blocks $SA_{ij}$.

Figure 6A:
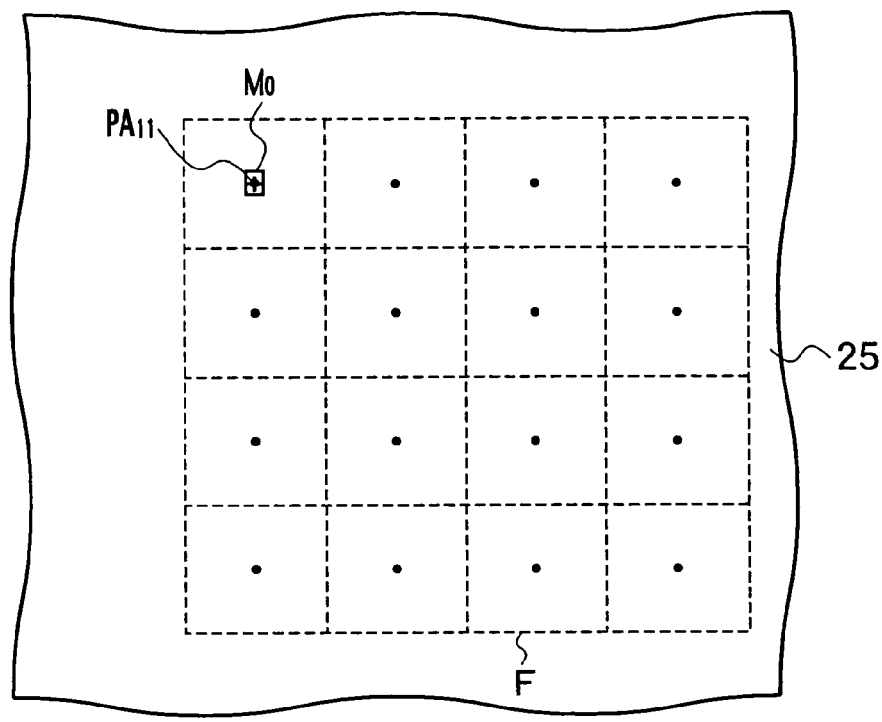
FIGS. 6A and 6B are schematic views for explaining moving a mark according to the embodiment of the present invention.
Figure 6B:
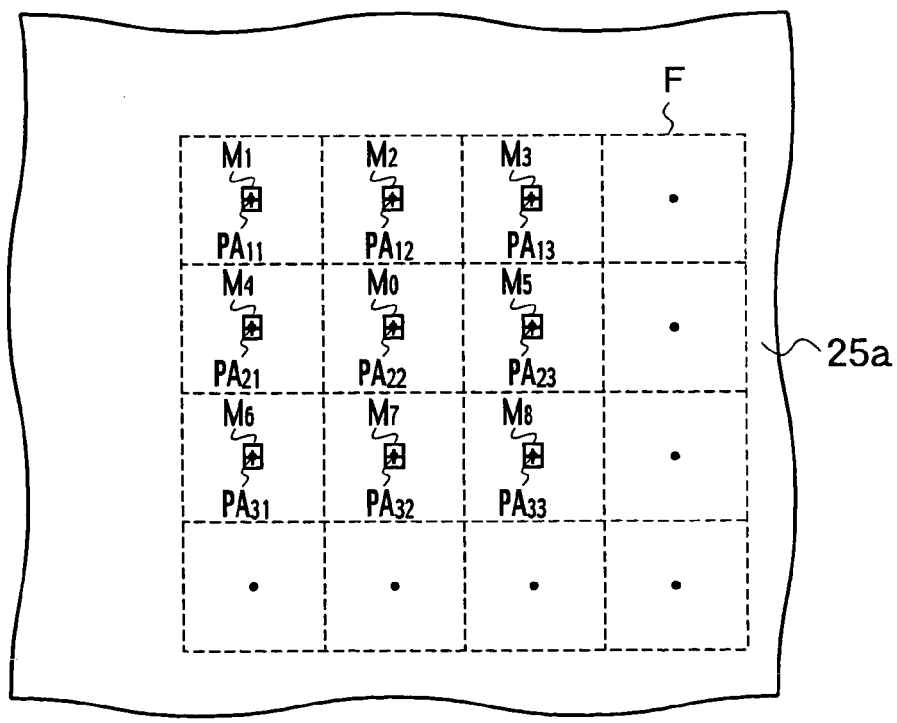
Figure 7:
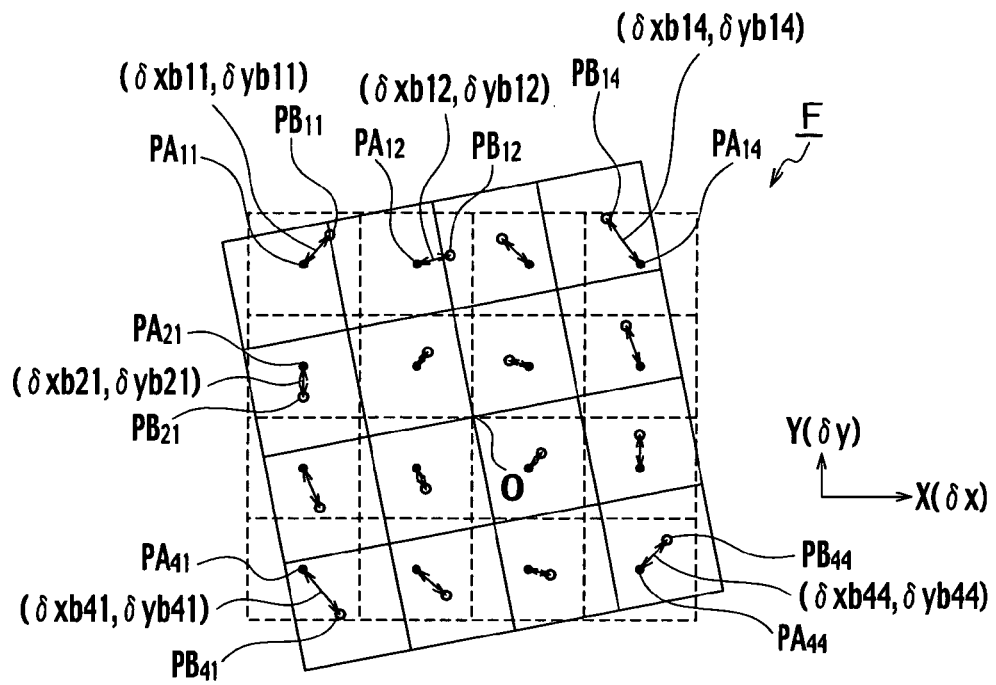
FIG. 7 to 10 are schematic views showing examples of initial aberration amounts inside a deflection area according to the embodiment of the present invention.

Here, as shown in FIG. 6A, the mark $M_0$ on the mark mount 25 is aligned with the initial target position $PA_{11}$ by driving the stage 26 based on the initial target positions $PA_{kl}$. Alternatively, as shown in FIG. 6B, the plurality of marks $M_0$ to $M_8$ on the mark mount 25a may be aligned with the initial target positions $PA_{11}$ to $PA_{33}$. An electron beam is deflected and directed onto the initial target position $PA_{11}$. Back-scattered electrons or secondary electrons from the mark $M_0$ are detected using the detector 24. Here, as shown in FIG. 7, a position which the electron beam actually illuminates after deflecting the electron beam to one of the initial target positions $PA_{kl}$ is determined an initial illumination position $PB_{kl}$. As shown in FIG. 7 for example, the initial illumination positions $PB_{kl}$ move to positions obtained from the initial target positions $PA_{kl}$ by rotating the deflection area F around the optical axis O. The initial obtainment module 42b shown in FIG. 1 obtains each of the initial illumination positions $PB_{kl}$ shown in FIG. 7. As shown in FIG. 7, the initial calculation module 42c respectively calculates differences between the initial target positions $PA_{kl}$ and the initial illumination positions $PB_{kl}$ as initial aberration amounts ($\delta xb_{kl}$, $\delta yb_{kl}$).

Figure 8:
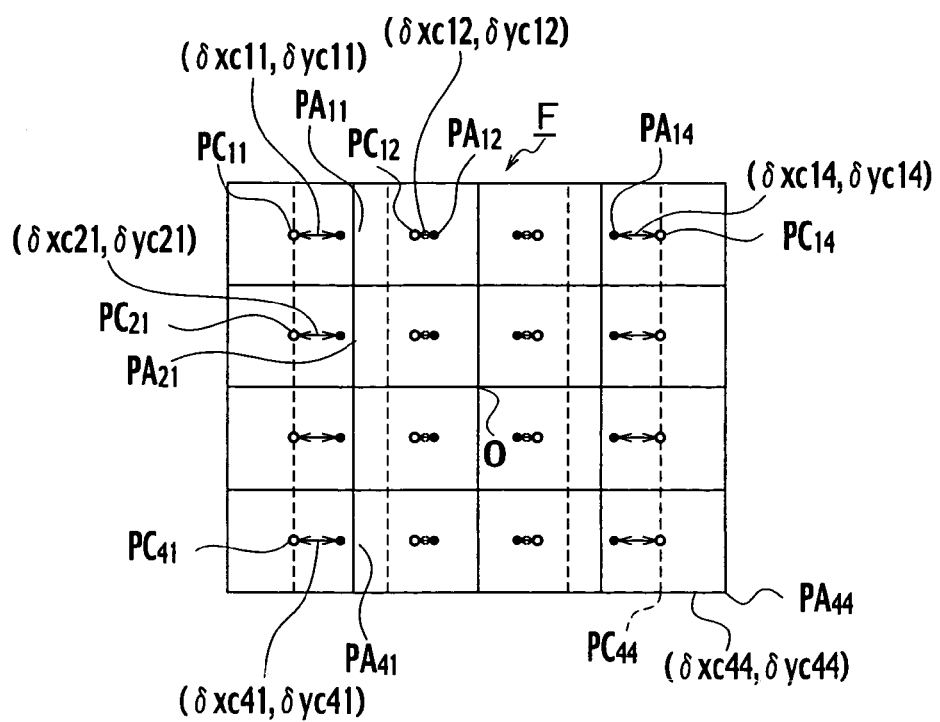
Figure 9:
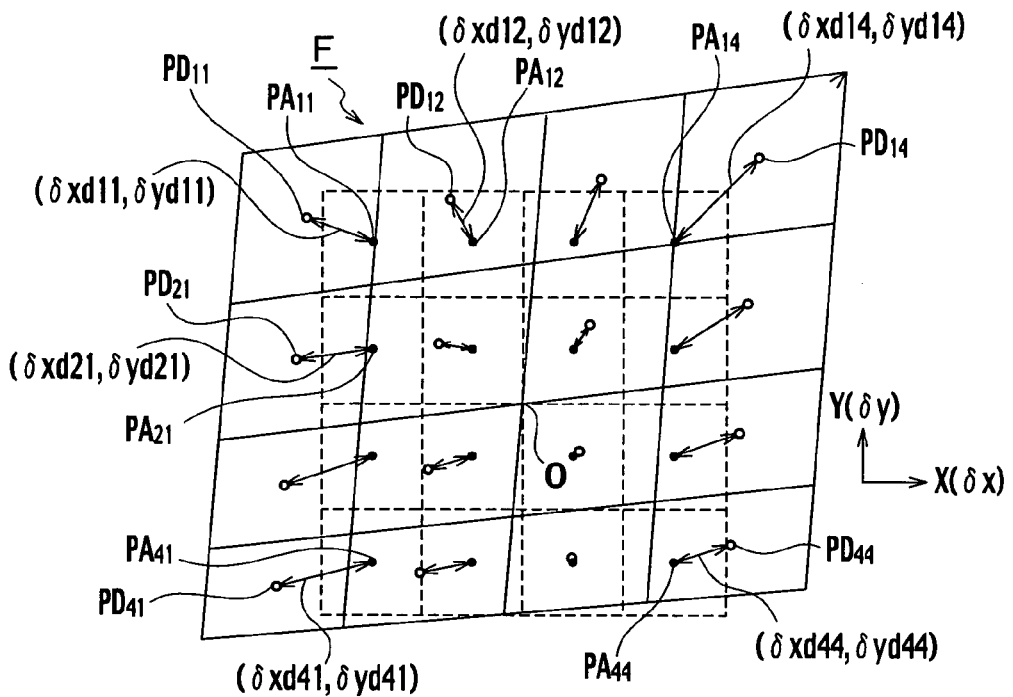
Figure 10:
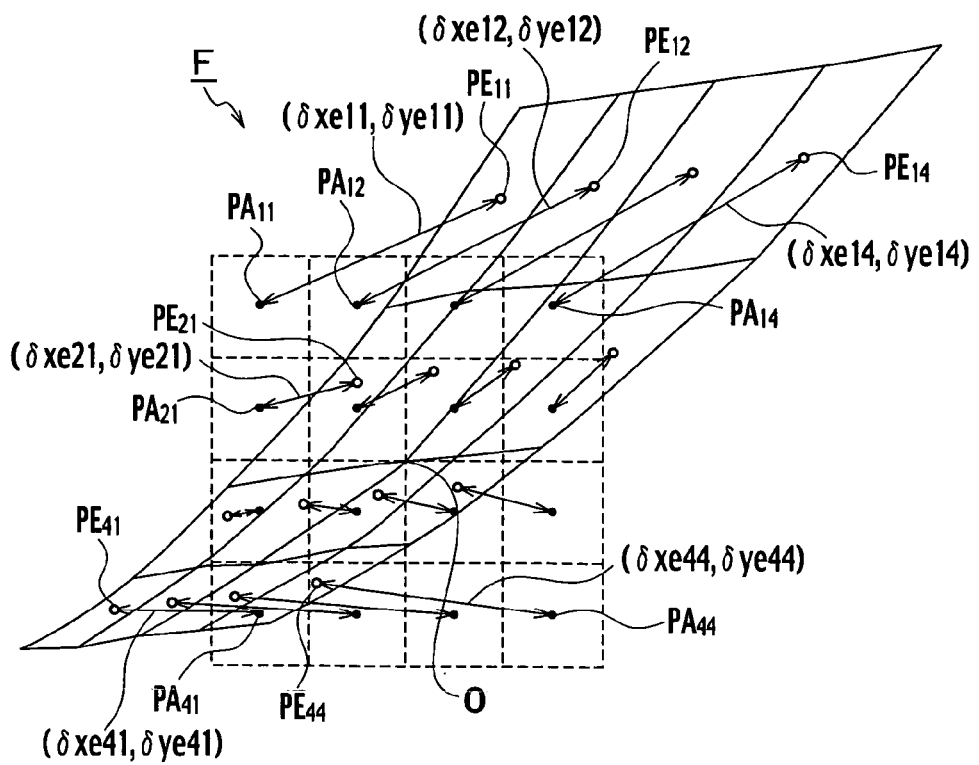

When initial illumination positions $PC_{kl}$, $PD_{kl}$ or $PE_{kl}$ as shown in FIGS. 8 to 10 respectively are obtained by the initial obtainment module 42b as well, the initial calculation module 42c similarly calculates initial aberration amounts ($\delta xc_{kl}$, $\delta yc_{kl}$), ($\delta xd_{kl}$, $\delta yd_{kl}$) or ($\delta xe_{kl}$, $\delta ye_{kl}$) from the initial target positions $PA_{kl}$, respectively. The initial illumination positions $PC_{kl}$ shown in FIG. 8 move to positions obtained from the initial target positions $PA_{kl}$ by, for example, linearly (proportionally) enlarging the deflection area F in one direction (the left or right direction shown on the drawing). The initial illumination positions $PD_{kl}$ shown in FIG. 9 move to positions obtained from the initial target positions $PA_{kl}$ by gradually and nonlinearly changing the distance of the deflection area F from the optical axis O. The initial illumination positions $PE_{kl}$ shown in FIG. 10 move to positions obtained from the initial target positions $PA_{kl}$ by steeply and nonlinearly changing the distance of the deflection area F from the optical axis O.

Figure 11:
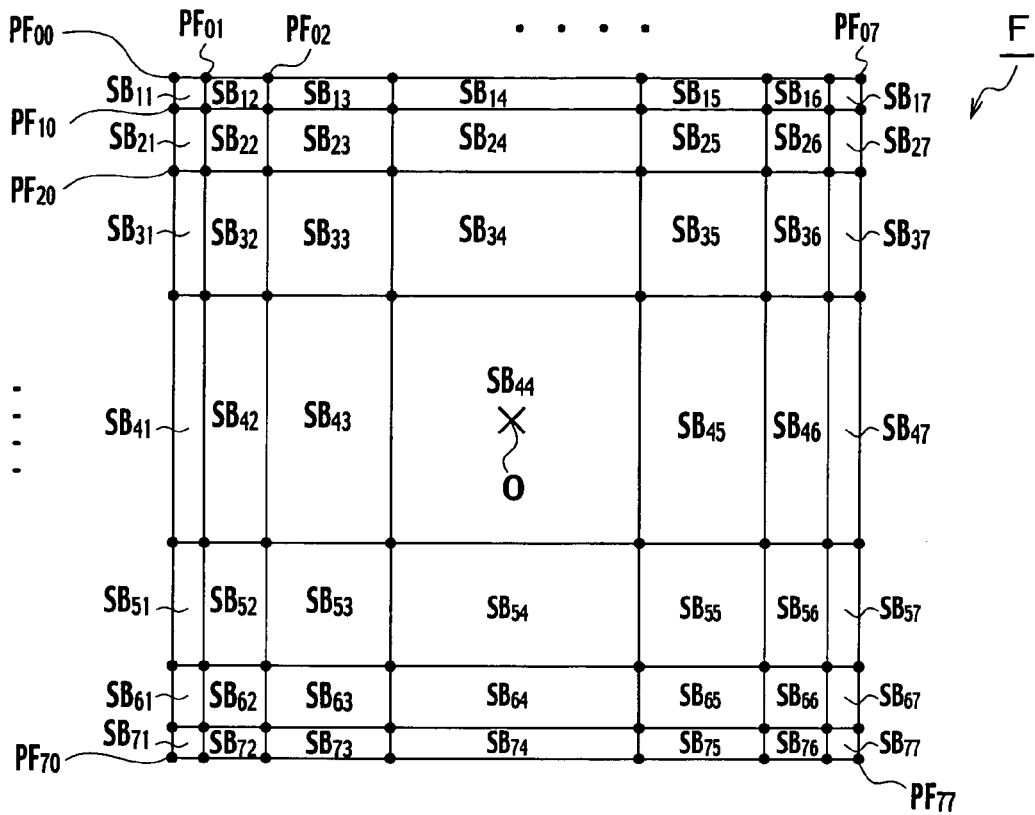
FIGS. 11 to 14 are schematic views showing examples of a plurality of main blocks into which the deflection area is divided according to the embodiment of the present invention.

The main division unit 43 shown in FIG. 1 respectively divides the deflection area F into a plurality of main blocks in accordance with the change rate of the initial aberration amounts ($\delta xb_{kl}$, $\delta yb_{kl}$), ($\delta xc_{kl}$, $\delta yc_{kl}$), ($\delta xd_{kl}$, $\delta yd_{kl}$), or ($\delta xe_{kl}$, $\delta ye_{kl}$) inside the deflection area F, the initial aberration amounts calculated by the initial calculation module 42c. When, as shown in FIGS. 7 and 8 for example, the initial aberration amounts ($\delta xb_{kl}$, $\delta yb_{kl}$) or ($\delta xc_{kl}$, $\delta yc_{kl}$) change linearly with, i.e. proportional to, the distance from the optical axis O (the front-face and back-face direction of the drawing), the deflection area F is divided into such a plurality of main blocks $SB_{mn}$ (m=1 to 7, n=1 to 7) that the sizes of the main blocks $SB_{mn}$ change linearly with the distance from the optical axis O, as shown in FIG. 11. In FIG. 11, the ratio between the lengths of one sides of the main blocks $SB_{11}$, $SB_{22}$, $SB_{33}$, and $SB_{44}$ is 1:2:4:8. The ratio between the areas of the main blocks $SB_{11}$, $SB_{22}$, $SB_{33}$, and $SB_{44}$ is 1:4:16:64, and the ratio between the areas of the main blocks $SB_{14}$, $SB_{24}$, $SB_{34}$, and $SB_{44}$ is 1:2:4:8.

Figure 12:
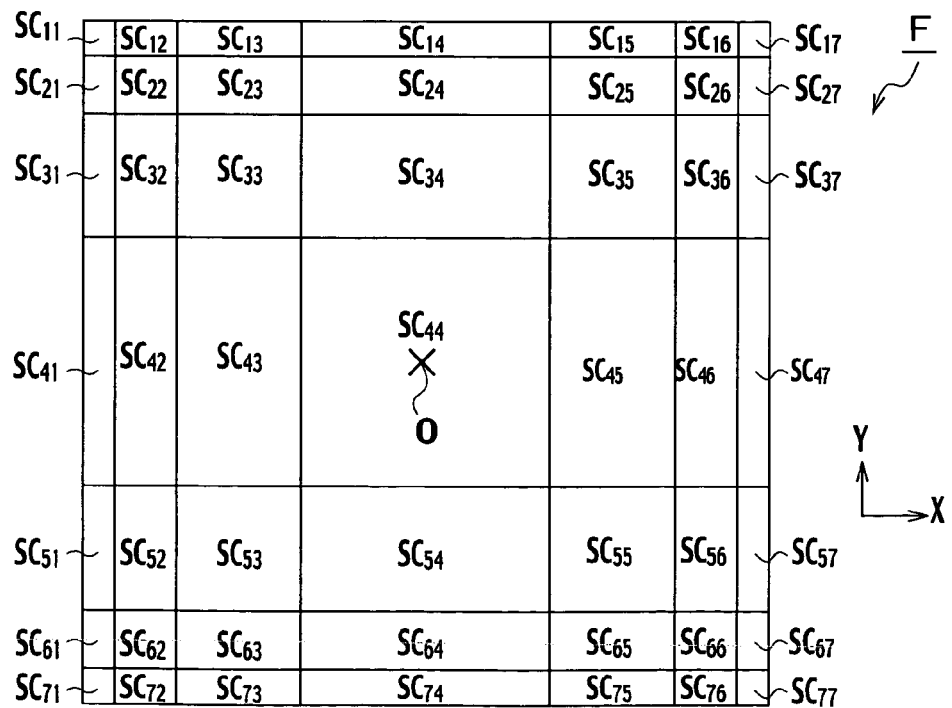
Figure 13:
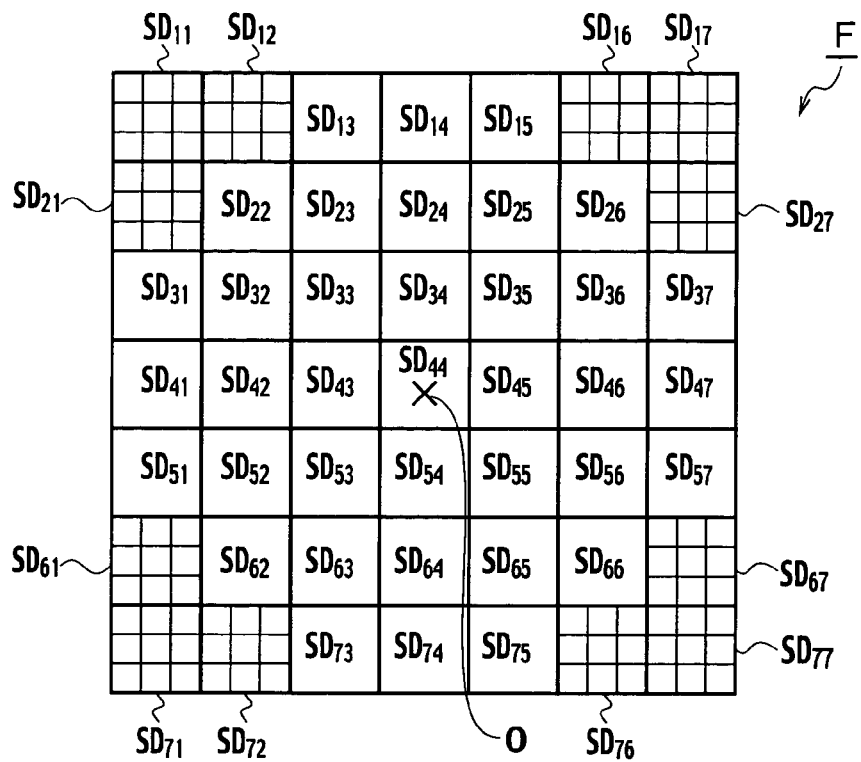
Figure 14:
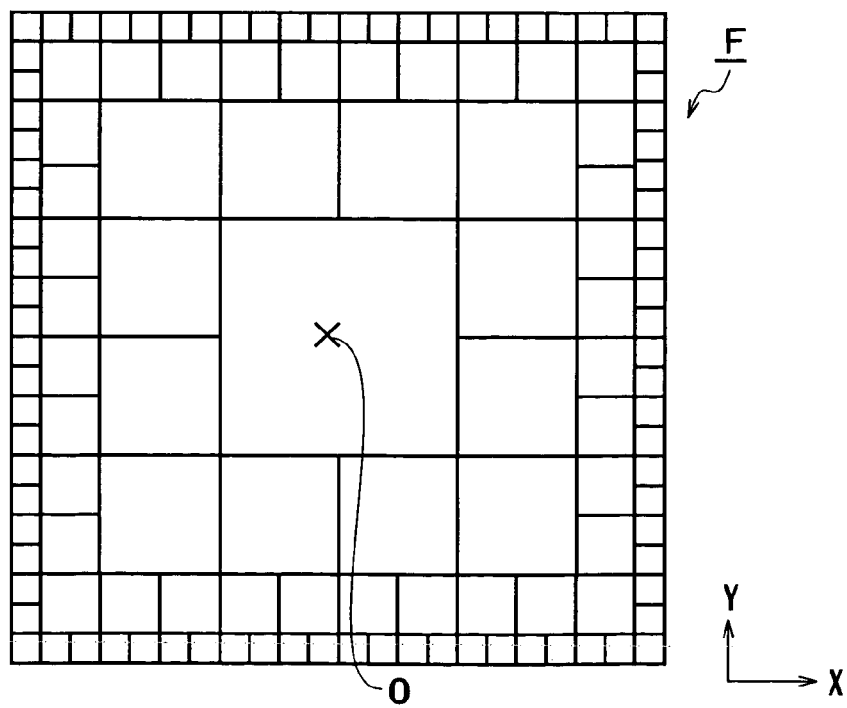

On the other hand, when, as shown in FIGS. 9 and 10, the initial aberration amounts ($\delta xd_{kl}$, $\delta yd_{kl}$) or ($\delta xe_{kl}$, $\delta ye_{kl}$) change nonlinearly with, i.e. do not change proportional to, the distance from the optical axis O, the deflection area F is divided into such a plurality of main blocks $SC_{mn}$ that the sizes of the main blocks $SC_{mn}$ change nonlinearly with the distance from the optical axis O, as shown in FIG. 12. In FIG. 12, the ratio between the lengths of one side of the main blocks $SC_{11}$, $SC_{22}$, $SC_{33}$, and $SC_{44}$ is 1:2:3:4. The ratio between the areas of the main blocks $SC_{11}$, $SC_{22}$, $SC_{33}$, and $SC_{44}$ is 1:4:9:16. The ratio between the areas of the main blocks $SC_{14}$, $SC_{24}$, $SC_{34}$, and $SC_{44}$ is 1:2:3:4. In particular, when the initial aberration amounts ($\delta xe_{kl}$, $\delta ye_{kl}$) change steeply as shown in FIG. 10, the deflection area F is divided into a plurality of blocks as shown in FIG. 13 or 14. In FIG. 13, the deflection area F is divided into a plurality of main blocks $SD_{mn}$ (m=1 to 7, n=1 to 7), and only the main blocks $SD_{11}$, $SD_{12}$, $SD_{16}$, $SD_{17}$, $SD_{21}$, $SD_{27}$, $SD_{61}$, $SD_{67}$, $SD_{71}$, $SD_{72}$, $SD_{76}$, and $SD_{77}$ are each further divided into a plurality of equal blocks (for example, 3×3=9 blocks). The main blocks shown in FIG. 14 are obtained by a combination of the division methods shown in FIGS. 11 to 13.

Furthermore, when the deflection area F includes first and second regions which have different change rates of the initial aberration amounts of the respective initial blocks, the first and second regions are each divided into a plurality of main blocks in accordance with the respective change rates of the initial aberration amounts in the first and second regions. In other words, the main division unit 43 divides a region where the initial aberration amounts are relatively large into relatively small main blocks in order to obtain a high accuracy, and divides a region where the initial aberration amounts are relatively small into relatively large main blocks.

Figure 15:
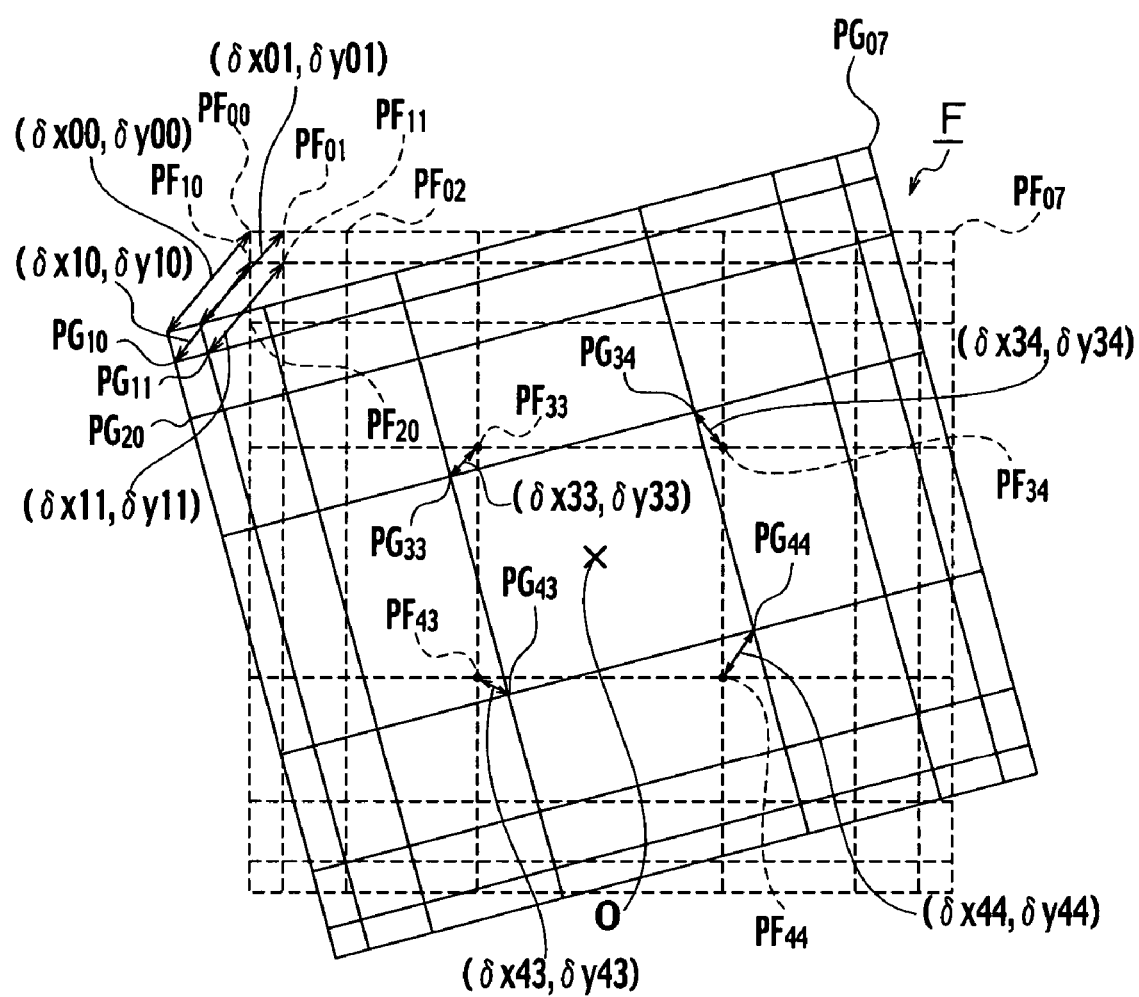
FIG. 15 is a schematic view showing an example of main aberration amounts inside the deflection area according to the embodiment of the present invention.

The main aberration calculation unit 44 shown in FIG. 1 includes a main setting module 44a, a main obtainment module 44b and a main calculation module 44c. As shown in FIG. 11, the main setting module 44a sets at least one main target position $PF_{op}$ (o=0 to 7, p=0 to 7) for each of the plurality of main blocks $SB_{mn}$. The main target positions $PF_{op}$ may be set at the positions of the grid points of the plurality of main blocks $SB_{mn}$ as shown in FIG. 11, or may be set at the centers of the respective main blocks $SB_{mn}$. As shown in FIG. 15, the main obtainment module 44b obtains a main illumination position $PG_{op}$ when an electron beam is deflected to each of the main target positions $PF_{op}$. The main calculation module 44c shown in FIG. 1 respectively calculates main aberration amounts ($\delta x_{op}$, $\delta y_{op}$) between the main target positions $PF_{op}$ and the main illumination positions $PG_{op}$ shown in FIG. 15.

When an electron beam is deflected to a desired illumination position, the correction unit 45 shown in FIG. 1 calculates the correction values ($X_0$, $Y_0$) using the correction equations (1) and (2), based on, for example, the main aberration amounts ($\delta x_{op}$, $\delta y_{op}$) calculated by the main calculation module 44c. Specifically, the correction values ($X_0$, $Y_0$) are calculated by substituting values ($x-\delta x_{op}$, $y-\delta y_{op}$) for terms x and y in the right sides of the correction equations (1) and (2), the values ($x-\delta x_{op}$, $y-\delta y_{op}$) obtained by subtracting the main aberration amounts ($\delta x_{op}$, $\delta y_{op}$) from the coordinates (x, y) of the desired illumination position, respectively.

The CPU 4 further includes a control unit and an exposure control unit, which are omitted from illustration. The control unit controls input and output of signals and performance of the CPU 4, the control circuit 3, input device 5, and the output device 6 shown in FIG. 2 or the like. The exposure control unit reads pattern data for exposure from a pattern data storage region 70 in the main memory 7 shown in FIG. 16. The exposure control unit controls electron beam exposure in the exposure unit 2 shown in FIG. 2.

Figure 16:
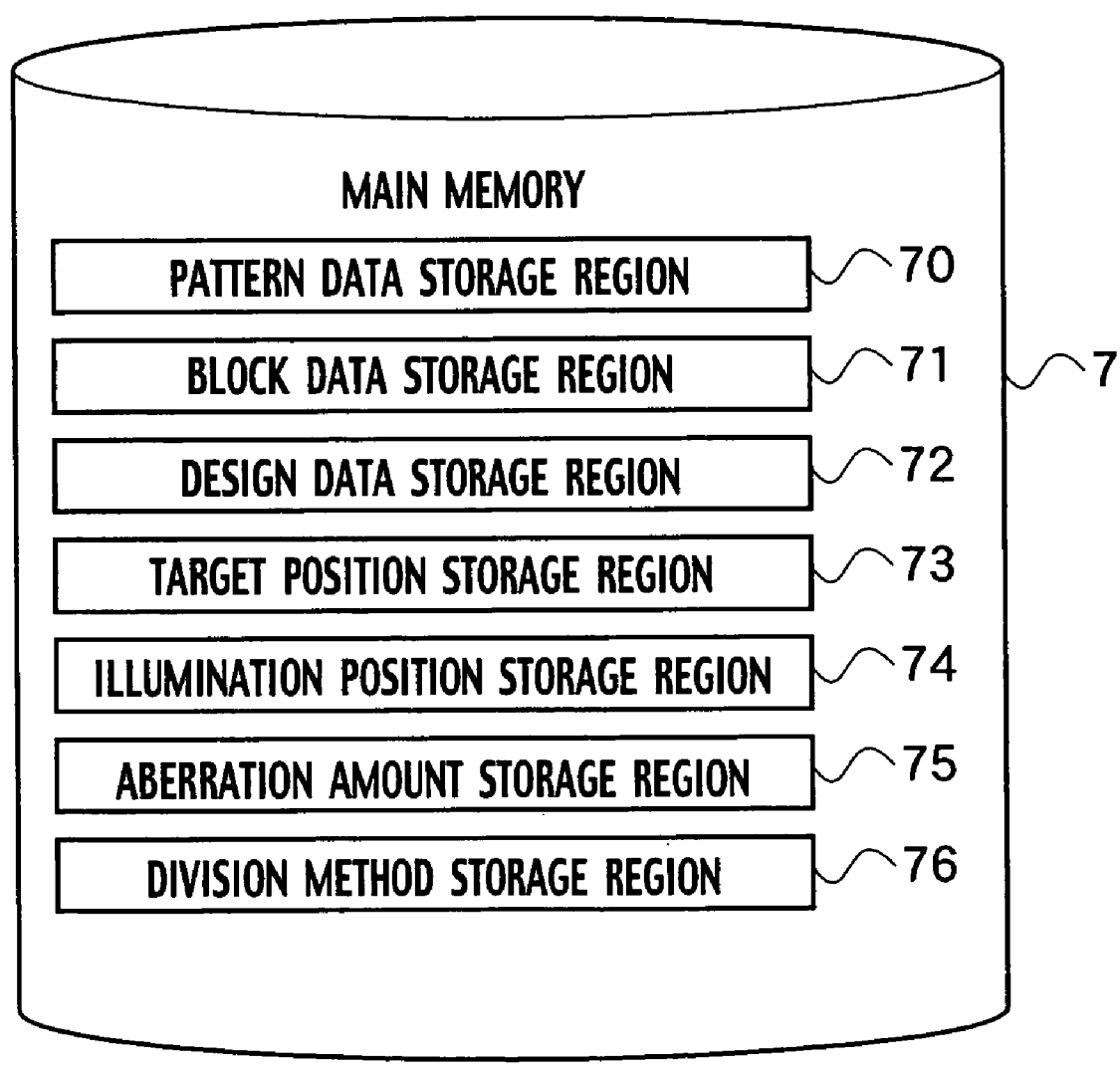
FIG. 16 is a block diagram showing an example of the main memory according to the embodiment of the present invention.

As shown in FIG. 16, the main memory 7 shown in FIG. 2 includes the pattern data storage region 70, a block data storage region 71, a design data storage region 72, a target position storage region 73, an illumination position storage region 74, an aberration amount storage region 75, and a division method storage region 76. The pattern data storage region 70 stores pattern data for exposure. The block data storage region 71 stores data of the plurality of equal initial blocks $SA_{ij}$ into which the deflection area F is divided by the initial division unit 41, and the plurality of main blocks $SB_{mn}$ into which the deflection area F is divides by the main division unit 43 and the like. The design data storage region 72 stores data of the construction and characteristics of the electron optics system of the electron beam drawing tool shown in FIG. 2, the construction and characteristics of the objective deflectors 22a and 22b, and the interval (period) between the marks $M_0$ to $M_8$ on the mark mount 25a and the like. The target position storage region 73 stores the initial target positions $PA_{kl}$ and the main target positions $PF_{op}$ set by the initial setting module 42a and the main setting module 44a respectively. The illumination position storage region 74 stores the initial illumination positions $PB_{kl}$ and the main illumination positions $PG_{op}$, obtained by the initial obtainment module 42b and the main obtainment module 44b respectively. The aberration amount storage region 75 stores the initial aberration amounts ($\delta xb_{kl}$, $\delta yb_{kl}$) and the main aberration amounts ($\delta x_{op}$, $\delta y_{op}$) calculated by the initial calculation unit 42c and the main calculation module 44c, respectively. The division method storage region 76 stores data of various division methods for dividing the deflection area F into the plurality of main blocks in advance.

The input device 5, shown in FIG. 2, may be, for example, a keyboard, a mouse, a recognition device such as a optical character readers (OCR), a drawing input device such as an image scanner, or a special input device such as a voice input device. The output device 6 may be a display device such as a liquid crystal display (LCD), CRT display, or a printing device such as an ink jet printer or a laser printer. The auxiliary memory 8 has random-access memory (RAM). The RAM serves as a temporary data memory for storing data used in executing a program by the CPU 4, and used as a working domain.

The program storage device 9 stores a program (a deflection distortion correction program) executed by the CPU 4 (the details of the program are described later). As the program storage device 9, a semiconductor memory, a magnetic disk, an optical disc, a magneto-optical disc and a magnetic tape, can be used. Specifically, a flexible disk, a CD-ROM, a MO disk, a cassette tape and an open reel tape, etc. can be used.

Next, a description will be given of an example of a method of correcting deflection distortion according to the embodiment of the present invention, referring to a flowchart of FIG. 17 as an example.

In step S100, as shown in FIG. 2, the mark mount 25 is placed on the stage 26. As shown in FIG. 4 with arrow, the mark $M_0$ on the mark mount 25 is moved to a nearby optical axis O, by moving the stage 26. The optical axis O substantially corresponds to the center of the deflection area F to which the electron beam is deflected. The electron beam is directed to the mark $M_0$ without deflection, and then the position of the mark $M_0$ is detected using the deflector 24. The stage 26 is fixed with the optical axis O based on the difference between the position of the mark $M_0$ and the actually illumination position of the electron beam, by moving the stage 26 in order to align the position of the mark $M_0$.

In step S101, as shown in FIG. 5, the initial division unit 41 shown in FIG. 1 virtually divides the deflection area F into a plurality of equal initial blocks $SA_{ij}$ (i=1 to 4, j=1 to 4) as an initial setting. The data of the plurality of initial blocks $SA_{ij}$ is stored in the block data storage region 71 shown in FIG. 16.

In step S102, the initial setting module 42a shown in FIG. 1 reads the data of the plurality of initial blocks $SA_{ij}$ from the block data storage region 71. The initial setting module 42a then sets initial target positions $PA_{kl}$ (k=1 to 4, j=1 to 4) defined inside the plurality of initial blocks $SA_{ij}$ for each of the plurality of the initial blocks $SA_{ij}$ shown in FIG. 5. In FIG. 5 for example, the initial target positions $PA_{kl}$ are set at the center of the initial blocks $SA_{ij}$ respectively. The initial target positions $PA_{kl}$ are stored in the target position storage region 73 shown in FIG. 16.

In step S103, as shown in FIG. 6A, the mark $M_0$ on the mark mount 25 is placed to the initial target positions $PA_{00}$ by driving the stage 26 based on the initial target positions $PA_{kl}$ from the target position storage region 73. An electron beam is deflected to the initial target positions $PA_{00}$. Back-scattered electrons or secondary electrons from the mark $M_0$ are detected using the deflector 24. The initial illumination positions $PB_{00}$ are obtained by the initial obtainment module 42b. As the same time, the mark $M_0$ is also moved to the initial target positions $PA_{01}$ to $PA_{44}$ one by one, and then the electron beam is deflected to the mark $M_0$. The position of the mark $M_0$ is detected using the deflector 24, and then the initial illumination positions $PB_{01}$ to $PB_{44}$ are obtained, as shown in FIG. 7. The initial illumination positions $PB_{kl}$ are stored in the illumination position storage region 74 shown in FIG. 16.

In step S104, the initial calculation unit 42c shown in FIG. 1 reads the initial illumination positions $PB_{kl}$ and the initial target positions $PA_{kl}$ from the illumination position storage region 74 and the target position storage region 73 respectively. The initial calculation unit 42c then calculates the difference between the initial target positions $PA_{kl}$ and the initial illumination positions $PB_{kl}$ shown in FIG. 7 as the initial aberration amounts ($\delta xb_{kl}$, $\delta yb_{kl}$). The initial aberration amounts ($\delta xb_{kl}$, $\delta yb_{kl}$) are stored in the aberration amount storage region 75 shown in FIG. 16.

In step S105, the main division unit 43 shown in FIG. 1 reads the initial aberration amounts ($\delta xb_{kl}$, $\delta yb_{kl}$) from the aberration amount storage region 75. The main division unit 43 then selects a suitable division method from among various division methods of the deflection area F from the division method storage region 76, in accordance with the change rate of the initial aberration amounts ($\delta xb_{kl}$, $\delta yb_{kl}$). As shown in FIG. 11, the main division unit 43 then divides the deflection area F into a plurality of main blocks $SB_{mn}$ (m=1 to 7, n=1 to 7) with the suitable division method. The data of the plurality of main blocks $SB_{mn}$ is stored in the block data storage region 71 shown in FIG. 16.

In step S106, the main setting module 44a shown in FIG. 1 reads the data of the plurality of main blocks $SB_{mn}$ from the block data storage region 71. As shown in FIG. 11, the main setting module 44a then sets at least one main target position $PF_{op}$ which is defined inside the plurality of main blocks $SB_{mn}$ for each of the plurality of main blocks $SB_{mn}$. For example, in FIG. 11, the main target positions $PF_{op}$ are set at the corners of grid positions of the plurality of main blocks $SB_{mn}$. The main target positions $PF_{op}$ is stored in the target position storage region 73 shown in FIG. 16.

In step S107, the mark $M_0$ on the mark mount 25 shown in FIG. 3A is placed to nearby the main target positions $PC_{00}$ shown in FIG. 11, by moving the stage 26 based on the main target positions $PF_{op}$ from the target position storage region 73. The electron beam is deflected to the mark $M_0$. The main illumination positions $PG_{00}$ shown in FIG. 15 are obtained by the main obtainment module 44b shown in FIG. 1, by detecting back-scattered electrons or secondary electrons from the mark $M_0$ using the deflector 24. The mark $M_0$ is also moved to the main target positions $PF_{01}$ to $PF_{77}$ one by one. The electron beam is deflected to the mark $M_0$. The main illumination positions $PG_{01}$ to $PG_{77}$ are obtained by detecting the position of the mark $M_0$. The main illumination positions $PG_{op}$ is stored in the illumination position storage region 74 shown in FIG. 16.

In step S108, the main calculation module 44c shown in FIG. 1 reads the main target positions $PF_{op}$ and the main illumination positions $PG_{op}$ stored in the target position storage region 73 and the illumination position storage region 74 respectively. The main calculation module 44c then calculates main aberration amounts ($\delta x_{op}$, $\delta y_{op}$) between the main target positions $PF_{op}$ and the main illumination positions $PG_{op}$. The main aberration amount such as the main aberration amounts $(\delta x_{33}, \delta y_{33})$, $(\delta x_{34}, \delta y_{34})$ $(\delta x_{43}, \delta y_{43})$, $(\delta x_{44}, \delta y_{44})$ or the like in the main blocks $SB_{44}$, which is relatively near the optical axis O, is calculated with relatively large intervals. Alternatively, the main aberration amount, for example, such as the main aberration amounts $(\delta x_{00}, \delta y_{00})$, $(\delta x_{01}, \delta y_{01})$, $(\delta x_{10}, \delta y_{10})$ $(\delta x_{11}, \delta y_{11})$ in the main blocks $SB_{11}$, which is relatively far from the optical axis O, is calculated by small intervals. The main aberration amounts $(\delta x_{op}, \delta y_{op})$ are stored in the aberration amount storage region 75 shown in FIG. 16.

In step S109, when an electron beam is deflected to a desired illumination position, the correction unit 45 reads the main aberration amounts $(\delta x_{op}, \delta y_{op})$ from the aberration amount storage region 75 corresponding to the main blocks having the desired illumination position from among the plurality of main blocks $SB_{mn}$. The correction unit 45 calculates correction values $(X_0, Y_0)$, by substituting the differences $(x-\delta x_{op}, y-\delta y_{op})$ subtracting the coordinates $(x, y)$ of the desired illumination position from the main aberration amounts $(\delta x_{op}, \delta y_{op})$ for terms x, y of the right side of the correction equations (1) and (2). A deflection distortion is corrected by applying a deflection voltage equivalent to the correction values $(X_0, Y_0)$ from the beam deflection circuit 34 to the objective deflectors 22a and 22b.

In the electron beam drawing tool, the more minutely the deflection area F is divided, the more accurately a deflection distortion can be corrected. However, the time for correction increases, and therefore the throughput is decreased. For example, when the deflection area F is equally divided by the size of the smallest main block $SB_{11}$ shown in FIG. 11 in order to provide a highly accurate correction, it is necessary to measure for 22×22=484 blocks, which requires an enormous amount of time.

On the other hand, according to an embodiment of the present invention, since the deflection area F is divided into 7×7=49 blocks as shown in FIG. 11, for example, about one tenth the frequency of and time for detecting marks is sufficient. Moreover, the deflection area F is divided into the plurality of main blocks $SB_{mn}$ using a suitable division method selected in accordance with the change rate of the initial aberration amounts $(\delta xb_{kl}, \delta yb_{kl})$ Accordingly, a block where the change rate of the initial aberration amounts $(\delta xb_{kl}, \delta yb_{kl})$ is relatively large is minutely divided in order to provide a highly accurate correction, and it is possible to obtain correction accuracy of a similar degree to that in the case of dividing the deflection area F into 484 blocks. As described above, according to an embodiment of the present invention, it is possible to correct a deflection distortion, due to the objective deflectors 22a and 22b, with high accuracy and in a short time.

In addition, in the step S105, when the change rate of the initial aberration amounts in an arbitrary region (first region) of the deflection area is different from the initial aberration amounts in another region (second region), the main division unit 43 divides the entire deflection area F into the plurality of equal main blocks $SD_{mn}$ (m=1 to 7, n=1 to 7) in accordance with the change rate of the first region, as shown in FIG. 13. Moreover, the main division unit 43 further divides the main blocks $SD_{11}$, $SD_{12}$, $SD_{16}$, $SD_{17}$, $SD_{21}$, $SD_{27}$, $SD_{61}$, $SD_{67}$, $SD_{71}$, $SD_{72}$, $SD_{76}$, and $SD_{77}$, which correspond to the second region, each into equal blocks (for example, 3×3=9 blocks). In addition, as shown in FIG. 14, the deflection area F may be divided using a combination of the division methods shown in FIGS. 11 to 13, in accordance with the change rates of the initial aberration amounts.

Note that in the correction method, even though the case obtaining the initial illumination positions $PB_{kl}$ shown in FIG. 7 in step S103 is showed as an example, it is also possible to correct a deflection distortion attribute to the objective deflectors 22a and 22b with high accuracy and in a short time when the initial illumination positions $PC_{kl}$, $PD_{kl}$, $PE_{kl}$ shown in FIG. 8 to FIG. 10 are obtained instead of the initial illumination positions $PB_{kl}$.

Next, a description will be given of an example of a program of correcting a deflection distortion according to an embodiment of the present invention. The deflection distortion correction program includes: dividing the deflection area of the electron beam into a plurality of equal initial blocks by the initial division unit 41, and storing the data of the deflection area divided in the block data storage region 71; calculating an initial aberration amount, generated when the electron beam is deflected and directed, for each of the plurality of initial blocks by the initial aberration calculation unit 42, and storing the initial aberration amount in the aberration amount storage region 75; dividing the deflection area into a plurality of main blocks by the main division unit 43 in accordance with a change rate of the initial aberration amount, and storing the data of the deflection area divided in the block data storage region 71; calculating a main aberration amount, generated when the electron beam is deflected and directed, for each of the plurality of main blocks by the main aberration calculation unit 44, and storing the main aberration amount in the aberration amount storage region 75; and calculating correction values for correcting a deflection distortion by the correction unit 45 based on the main aberration amount. The deflection distortion correction program is executed by the CPU 4 shown in FIG. 1. The deflection distortion correction program can be stored in a computer-readable storage medium such as the program storage device 9. The above-described correction method is carried out by a computer system, such as the CPU 4 shown in FIG. 2, reading the recording medium so as to execute the deflection distortion correction program.

Figure 18:
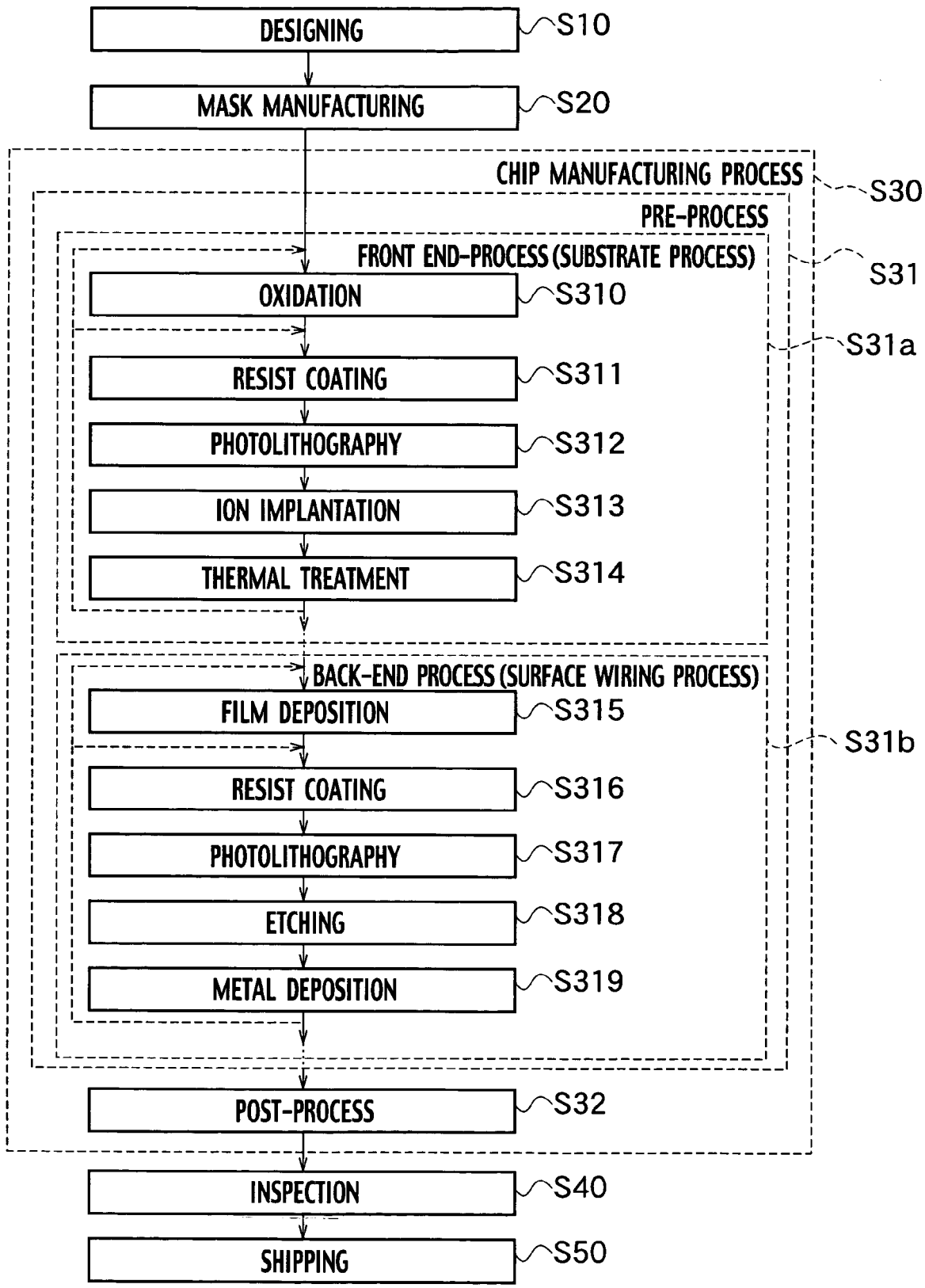
FIG. 18 is a flowchart for explaining a method for manufacturing a semiconductor device according to the embodiment of the present invention.

Next, a description will be made regarding a method for manufacturing a semiconductor device (a large-scale integrated circuit LSI) by use of the electron beam drawing tool shown in FIG. 2, with reference to FIG. 18. As shown in FIG. 18, the method for manufacturing a semiconductor device according to an embodiment of the present invention includes a design process in Step S10, a mask manufacturing process in Step S20, and a chip manufacturing process in Step S30. The chip manufacturing process in Step S30 includes a pre-process (wafer process) for fabricating an integrated circuit on a silicon wafer in Step S31a, and post-processing (assembly process) from dicing to inspection in Step S31b. Now, a description will be given below regarding the details of the respective processes.

First, process mask simulation is carried out in Step S10. Device simulation is performed by use of a result of the process mask simulation and each value of currents and voltages to be input to each of the electrodes is set. Circuit simulation of the LSI is performed based on electrical properties obtained by the device simulation. Accordingly, layout data of device patterns is generated for each layer of the device layers corresponding to each stage in a manufacturing process.

In step S20, pattern data of mask (drawing mask data) corresponding to each of the layers of a semiconductor chip is determined, using a CAD system based on patterns such as a layout designed in the design process in step S10. In the electron beam drawing tool (the pattern generator) shown in FIG. 2, the deflection area to which the electron beam is deflected is divided into a plurality of equal initial blocks as an initial setting (steps S100 and S101 in FIG. 17). The initial aberration amounts generated when the electron beam is deflected and directed is calculated for each of the plurality of the initial blocks (steps S102 to S104). The deflection area is divided into a plurality of main blocks in accordance with the change rate of the initial aberration amounts (step S105). The main aberration amounts generated when the electron beam is deflected and directed is calculated for each of the plurality of main blocks (steps S106 to S108). The main aberration amount is stored in the main memory 7. The correction values for correcting a deflection distortion are calculated based on the main aberration amounts of exposure (step S109). In the electron beam drawing tool, a deflection distortion is corrected by applying a deflection voltage, which is equivalent to correction values, to the deflector. Photo masks for each of the layers corresponding to each stage is delineated on a mask substrate made of a material such as quartz glass or the like, by deflecting an electron beam by use of the deflector. Consequently, a set of masks for each layers of the semiconductor device is prepared.

Next, a series of processes including an oxidation process in Step S310, a resist coating process in Step S311, the photolithography process in Step S312, an ion implantation process in Step S313, a thermal treatment process in Step S314, and the like are repeatedly performed in a front-end process (substrate process) in Step 31a. In step S313, a resist film (a photo resist film) is spin-coated on a semiconductor wafer. In Step S312, a resist films on the semiconductor wafers is exposed by the step-and-repeat method and patterned, by use of an exposure device (an aligner) with the masks corresponding layer. Accordingly, etching masks are delineated. In step S313, the semiconductor wafer is processed using the etching masks delineated in step S312. When the above-described series of processes are completed, the procedure advances to Step S31b.

Next, a back-end process (surface wiring process) for wiring the substrate surface is performed in Step S31b. A series of processes including a chemical vapor deposition (CVD) process in Step S315, a resist coating process in Step S316, the photolithography process in Step S317, an etching process in Step 318, a metal deposition process in Step 319, and the like are repeatedly performed in the back-end process. In Step S317, etching masks made of resist film are delineated by exposing device patterns of one of a mask in the set of masks using the exposure system. When the above-described series of processes are completed, the procedure advances to Step S32.

When a multilayer wiring structure is competed and the pre-process is finished, the substrate is diced into chips of a given size by a dicing machine such as a diamond blade in Step S32. The chip is then mounted on a packaging material made of metal, ceramic or the like. After electrode pads on the chip and leads on a leadframe are connected to one another, a desired package assembly process such as plastic molding is performed.

In Step S40, the semiconductor device is completed after an inspection of properties relating to performance and function of the semiconductor device, and other given inspections on lead shapes, dimensional conditions, a reliability test, and the like. In Step S50, the semiconductor device which has cleared the above-described processes is packaged to be protected against moisture, static electricity and the like, and is then shipped out.

According to the method for manufacturing a semiconductor device according to the embodiment of the present invention, it is possible to correct a deflection distortion by a deflector of the electron beam drawing tool with high accuracy and in a short time in step S20. Therefore, it is possible to avoid reduction in yields, to reduce manufacturing costs, and to effectuate mass production in a short time.

Figure 17:
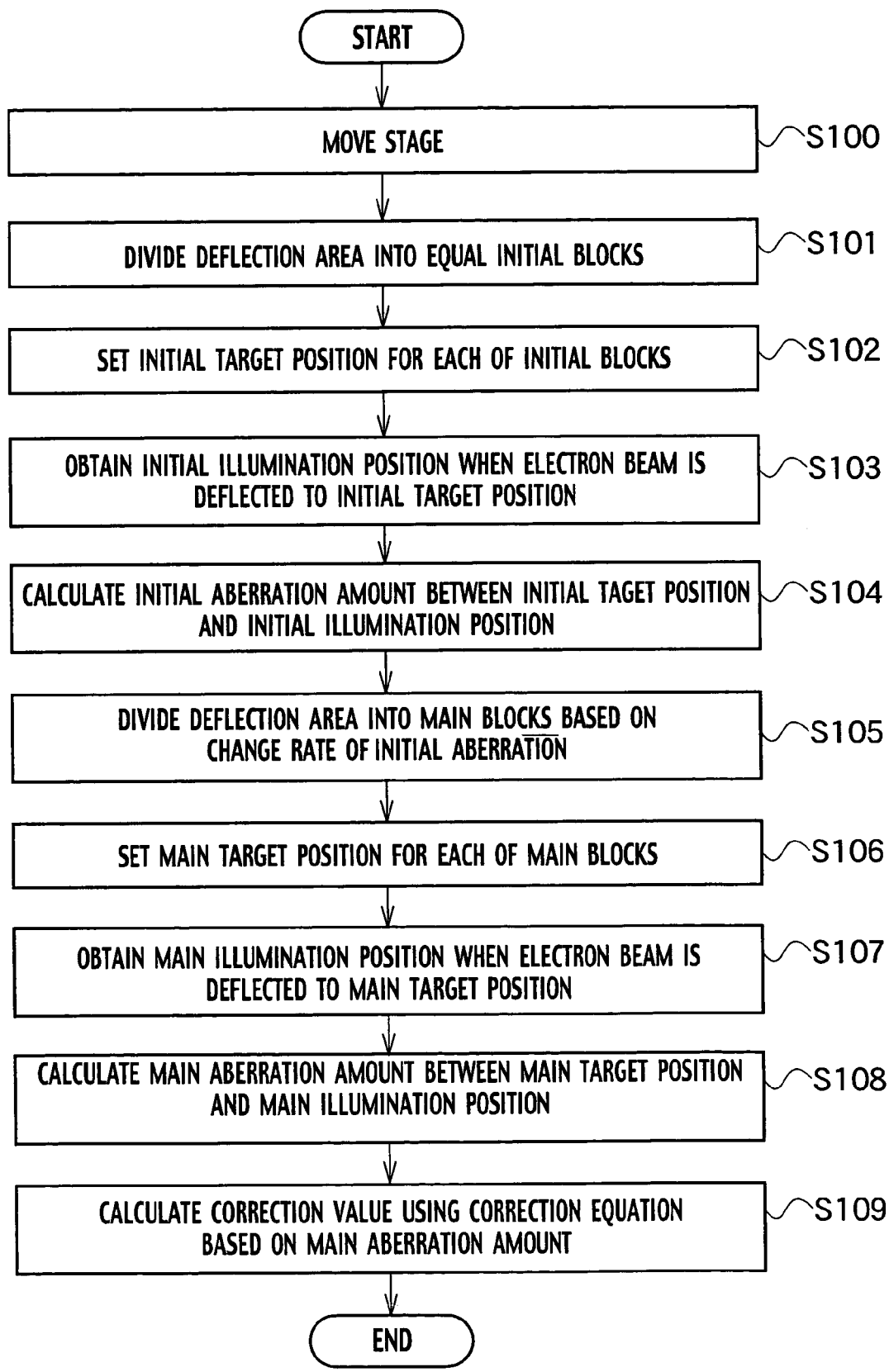
FIG. 17 is a flowchart for explaining a correction method according to the embodiment of the present invention.
Figure 21:
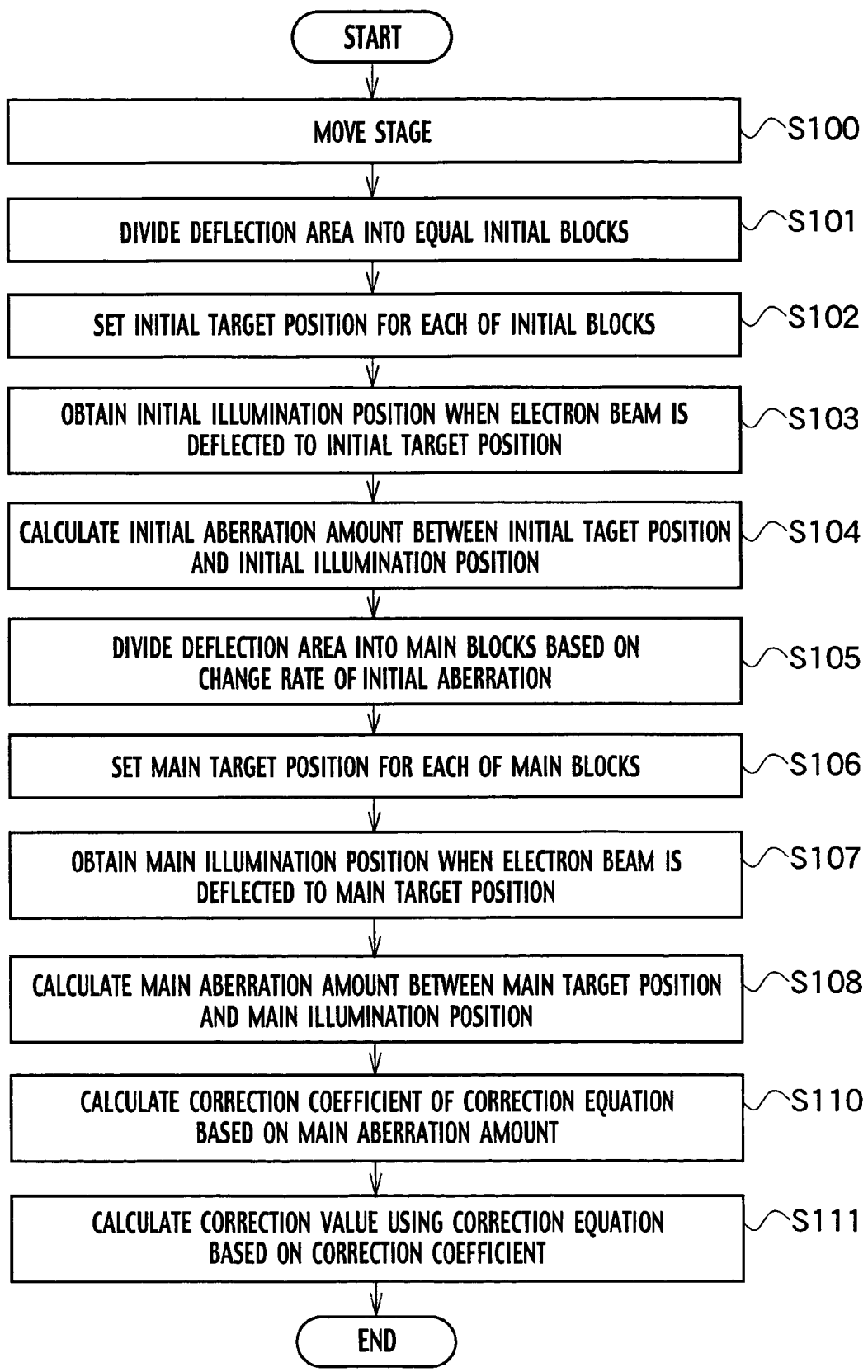
FIG. 21 is a flowchart for explaining a correction method according to the modification of the present invention.

Note that in step S20, even though the procedure which is the same as the steps S100 to S109 shown in FIG. 17 is explained, new correction coefficients $A_0$ to $A_9$, $B_0$ to $B_9$ can be calculated based on the main aberration amounts (step S110 shown in FIG. 21), and correction values can be calculated using the new correction coefficients $A_0$ to $A_9$, $B_0$ to $B_9$ in steps S100 to S111 shown in FIG. 21.

Furthermore, in the photolithography process in steps S312 and S317 shown in FIG. 18, as for the exposure device, the electron beam drawing tool shown in FIG. 2 can be used instead of the aligner. It is possible to delineate device patterns to the resist film on the semiconductor substrate with high accuracy, by correcting a deflection distortion using the electron beam drawing tool shown in FIG. 2 in steps S100 to 109. Accordingly, it is possible to avoid reduction in yields, and to reduce manufacturing costs. Note that, drawing can be carried out based on the pattern data generated in step S20 without preparing the set of masks in step S20.

(Modification)

Figure 19:
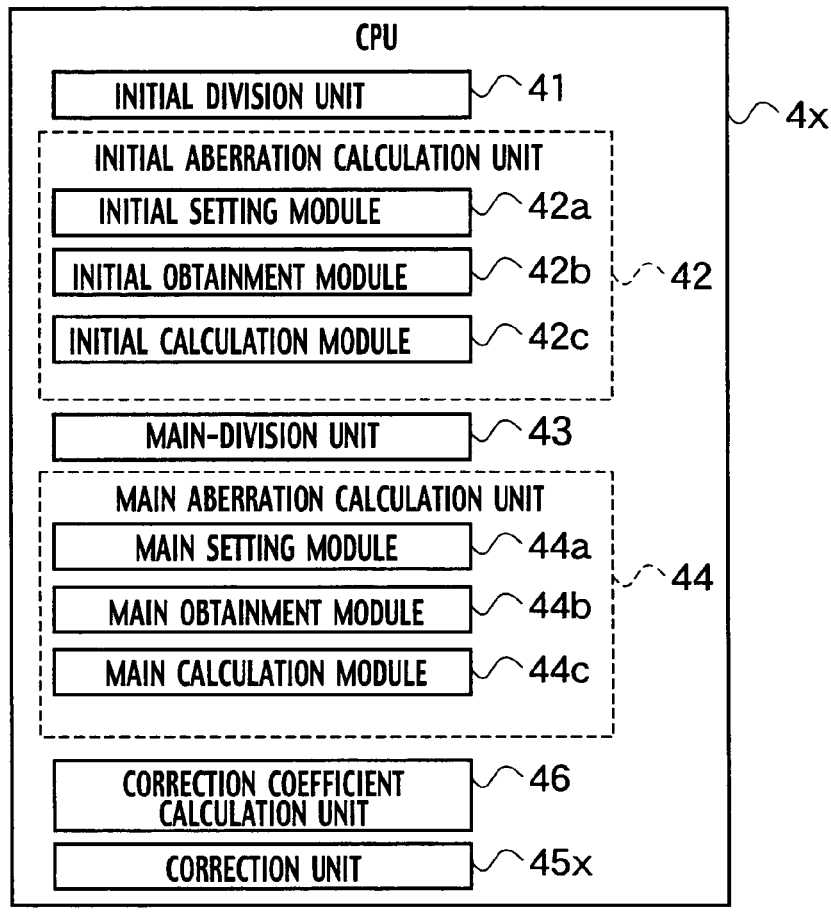
FIG. 19 is a block diagram showing an example of a central processing unit (CPU) according to a modification of the present invention.
Figure 20:
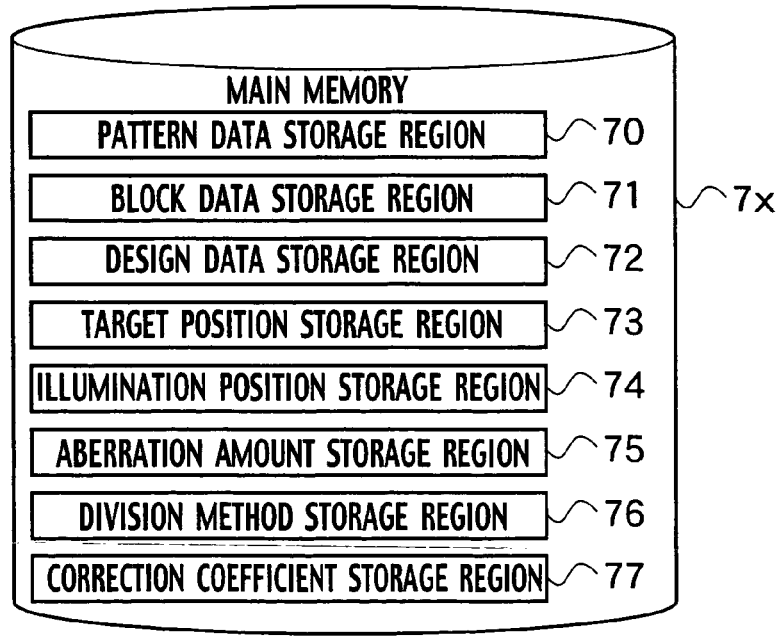
FIG. 20 is a block diagram showing an example of a main memory according to the modification of the present invention.

In an electron beam drawing tool according to a modification of the present invention, as shown in FIGS. 19 and 20, a CPU 4x and a main memory 7x are different from the CPU 4 and the main memory 7 shown in FIG. 1, respectively. The CPU 4x shown in FIG. 19 further includes a correction coefficient calculation unit 46, and a correction unit 45x, which is different from the correction unit 45 shown in FIG. 1.

The correction coefficient calculation unit 46 substitutes, for example, the coordinates of the main target positions $PF_{op}$ shown in FIG. 11, which are set by the main setting module 44a, for the terms x and y in the right sides, of the correction equations (1) and (2) while dealing with the correction coefficients $a_0$ to $a_9$ and $b_0$ to $b_9$ in the correction equations (1) and (2) as unknowns. Further, the correction coefficient calculation unit 46 substitutes the coordinates of the main illumination positions $PG_{op}$ shown in FIG. 15, which are obtained by the main obtainment module 44b, for $X_0$ and $Y_0$ in the left sides, of the correction equations (1) and (2). Thus, the correction coefficient calculation unit 46 calculates new correction coefficients $A_0$ to $A_9$ and $B_0$ to $B_9$ using the simultaneous equations.

For example, in the case of the initial aberration amounts ($\delta xb_{kl}$, $\delta yb_{kl}$) shown in FIG. 7, the values of new correction coefficients $A_0$ to $A_9$ and $B_0$ to $B_9$ are calculated as having the following relationships: $A_1>1$, $B_1=1$, $A_2$ to $A_9=0$, and $B_2$ to $B_9=0$. In the case of the initial aberration amounts ($\delta xc_{kl}$, $\delta yc_{kl}$) shown in FIG. 8, the values of new correction coefficients $A_0$ to $A_9$ and $B_0$ to $B_9$ have the following relationships: $A_1=B_1=1$, $A_2"$ 0, $A_0$ and $A_3$ to $A_9=0$, and $B_0$ and $B_2$ to $B_9=0$. Moreover, in the case of the initial aberration amounts ($\delta xd_k$, $\delta yd_{kl}$) or ($\delta xe_{kl}$, $\delta ye_{kl}$) shown in FIGS. 9 and 10, respectively, the values of new correction coefficients $A_0$ to $A_9$ and $B_0$ to $B_9$ have the following relationships: $A_0$ to $A_9"0$ and $B_0$ to $B_9"0$.

A set of the new correction coefficients $A_0$ to $A_9$ and $B_0$ to $B_9$ may be calculated, for example, for the entire deflection area F shown in FIG. 11. When it is insufficient for correction, even by calculating one set of the correction coefficients $A_0$ to $A_9$ and $B_0$ to $B_9$ for the entire deflection area F, the correction coefficients $A_0$ to $A_9$ and $B_0$ to $B_9$ may be calculated for each of the main blocks $SB_{mn}$. In addition, the correction coefficients $A_0$ to $A_9$ and $B_0$ to $B_9$ may be calculated selectively for each of some arbitrary main blocks (e.g., $SB_{11}$) in which the change rate of the main aberration amounts is large, for example, among the plurality of main blocks $SB_{mn}$.

Furthermore, the correction coefficient calculation unit 46 may check whether or not the values of new correction coefficients $A_0$ to $A_9$ and $B_0$ to $B_9$ are suitable for correction. Specifically, for example, the coordinates of any of the main target positions $PF_{op}$ shown in FIG. 11 are substituted for the terms x and y in the right sides, of the correction equations (1) and (2) using the new correction coefficients $A_0$ to $A_9$ and $B_0$ to $B_9$, thereby calculating the correction values $(X_0, Y_0)$. A deflection voltage equivalent to the correction values $(X_0, Y_0)$ is applied to the objective deflectors 22a and 22b, thereby deflecting an electron beam. The suitability for correction is checked by comparing the main aberration amount $(\delta x_{op}, \delta y_{op})$ between the main illumination position $PG_{op}$ and the main target position $PF_{op}$ shown in FIG. 20, with an arbitrarily set tolerance. Note that the main illumination positions $PG_{op}$ may be obtained by actually measurement, or by simulation.

The correction unit 45x calculates correction values $(X_0, Y_0)$ using the correction equations (1) and (2) which have new correction coefficients $A_0$ to $A_9$, $B_0$ to $B_9$ calculated by the correction coefficient calculation unit 46. A deflection distortion by the objective deflectors 22a and 22b is corrected, by applying a deflection voltage equivalent to the correction values $(X_0, Y_0)$ from the beam deflection circuit 34 to the objective deflectors 22a and 22b.

The main memory 7x shown in FIG. 20 further includes a correction coefficient storage region 77 which is different from the main memory 7 shown in FIG. 1. The correction coefficient storage region 77 stores new correction coefficients $A_0$ to $A_9$, $B_0$ to $B_9$ calculated by the correction coefficient calculation unit 46 shown in FIG. 20. The constitution of the electron beam drawing tool according to the modification of the present invention is substantially the same as the constitution of the electron beam drawing tool shown in FIG. 2, and thus no further description the constitution of the electron beam drawing tool is provided.

Next, a description will be given of an example of a method of correcting deflection distortion according to the modification of the present invention, referring to a flowchart of FIG. 21 as an example.

The procedure of steps S100 to S108 is substantially the same as the procedure shown in FIG. 17, and thus no further description the procedure of the step S100 to S108 is provided. In step S110, the correction coefficient calculation unit 46 shown in FIG. 19 calculates new correction coefficients $A_0$ to $A_9$, $B_0$ to $B_9$ using the correction equations (1) and (2), based on the main aberration amounts $(\delta x_{op}, \delta y_{op})$ between the main target positions $PF_{op}$ and the main illumination positions $PG_{op}$ for each of the plurality of main blocks $SB_{mn}$ from the aberration amount storage region 75 shown in FIG. 20. The new correction coefficients $A_0$ to $A_9$, $B_0$ to $B_9$ are stored in the correction coefficient storage region 77. Furthermore, the correction coefficient calculation unit 46 may check whether the new correction coefficients $A_0$ to $A_9$, $B_0$ to $B_9$ are adequate for correction or not. As a result of the check, when the new correction coefficients $A_0$ to $A_9$, $B_0$ to $B_9$ are unsuitable for correction, the procedure return to step S105, the main division unit 43 can select another division method for suitable for correction in accordance with a change rate of the initial aberration amounts, and then can divide the deflection area F.

In step S111, when the electron beam is deflected to a desired illumination position, the correction unit 45x reads the new correction coefficients $A_0$ to $A_9$, $B_0$ to $B_9$ from the correction coefficient storage region 77 shown in FIG. 20. Correction values $(X_0, Y_0)$ are calculated by substituting the coordinates of desired illumination position for terms x, y of the right side of the correction equations (1) and (2) with the new correction coefficients $A_0$ to $A_9$, $B_0$ to $B_9$. A deflection distortion by the objective deflectors 22a and 22b is corrected by applying a deflection voltage equivalent to the correction values $(X_0, Y_0)$ from the beam deflection circuit 34 to the objective deflectors 22a and 22b. When the correction coefficients $A_0$ to $A_9$, $B_0$ to $B_9$ are calculated for each of the respective plurality of main blocks $SB_{mn}$ in step S110, the correction unit 45x reads the correction coefficients $A_0$ to $A_9$, $B_0$ to $B_9$ corresponding to the main blocks of the desired illumination position. The correction unit 45x then calculates correction values $(X_0, Y_0)$ using the correction coefficients $A_0$ to $A_9$, $B_0$ to $B_9$. Accordingly, it is possible to correct a deflection distortion with high accuracy.

According to the electron beam drawing tool provided with the CPU 4x shown in FIG. 19, even in the case that new correction coefficients $A_0$ to $A_9$, $B_0$ to $B_9$ is calculated, and correction values $(X_0, Y_0)$ are calculated using the new correction coefficients $A_0$ to $A_9$, $B_0$ to $B_9$, it is possible to achieve high accuracy correction, and throughput can be improved, the same as that of the electron beam drawing tool shown in FIG. 2.

Note that since each of the correction equations (1) and (2) has ten unknowns $A_0$ to $A_9$ or $B_0$ to $B_9$, respectively, it is sufficient to set at least ten main target positions $PF_{op}$ in the entire deflection area F in the step S106 when one set of the correction coefficients $A_0$ to $A_9$ and $B_0$ to $B_9$ are calculated for the entire deflection area F in the step S110. On the other hand, when the correction coefficients $A_0$ to $A_9$ and $B_0$ to $B_9$ are calculated for each of the plurality of main blocks $SB_{mn}$, it is sufficient to set at least ten main target positions $PF_{op}$ for each of the plurality of main blocks $SB_{mn}$.

(Other Embodiment)

Figure 22:
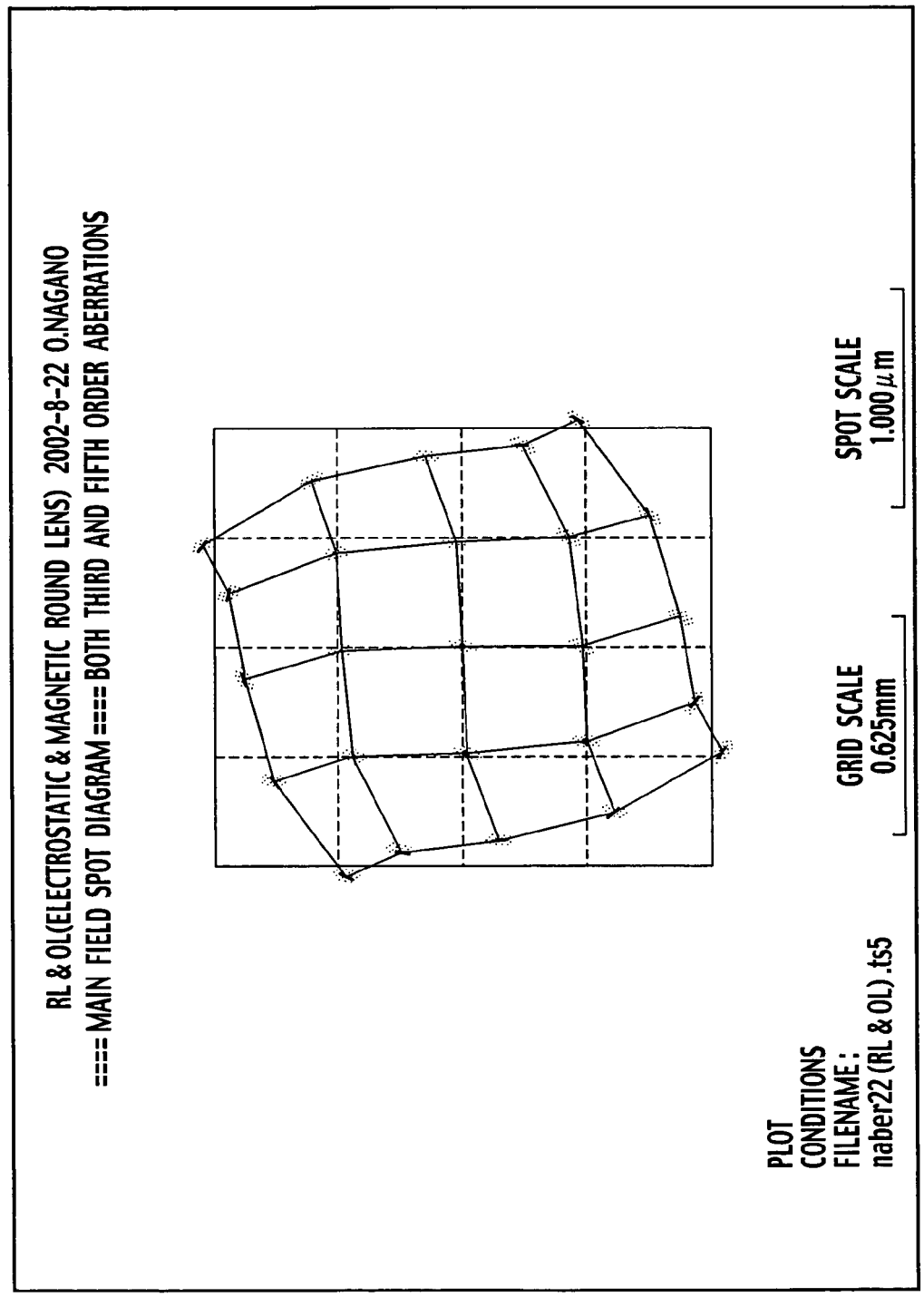
FIG. 22 is a schematic view for explaining a simulation result according to the modification of the present invention.

As another embodiment of the present invention, although a description is given, in the step S103 of FIGS. 17 and 21, of the case where the initial illumination positions, which are actually illuminated by an electron beam, are obtained by the initial obtainment module 42b shown in FIG. 19, the initial obtainment module 42b may be a simulator. In the case of using the simulator, an electron beam is virtually deflected and directed by simulation based on the data of the construction of the objective deflectors 22a and 22b, and of the electron optical system, which are stored in the design data storage unit 72, and also based on the data of the deflection voltage and the like. As a result, the main illumination positions, which are virtually illuminated by the electron beam, are obtained as shown in FIG. 22.

Moreover, in the step S101 of FIGS. 17 and 21, for convenience of explanation, the deflection area is equally divided into 4×4=16 initial blocks $SA_{11}$ to $SA_{44}$ as shown in FIG. 5. However, the number of the initial blocks into which the deflection area is equally divided, and the size of the initial blocks are not particularly limited as long as each falls in a range that enables the change rate of the initial aberration amounts $(\delta xb_{kl}, \delta yb_{kl})$ to be recognized.

Further, in the step S105 of FIGS. 17 and 21, the deflection area F is divided into the plurality of main blocks: 7×7=49 main blocks shown in FIGS. 11 and 12, 145 main blocks shown in FIG. 13, and 133 main blocks shown in FIG. 14. However, the number of main blocks and the size of the main blocks is not particularly limited as long as each falls in a range that enables sufficient accuracy to be obtained, and as long as the time for the measurement and correction falls within an arbitrarily set range.

Furthermore, it is possible to use n degree polynomials (n≧4) instead of the cubic polynomials shown in the correction equations (1) and (2). In the case of using n degree polynomials, it is sufficient that, in the steps S103 and S107 of FIGS. 17 and 21, the mark is detected at a number of points equal to or more than the number of unknowns serving as the coefficients of the respective terms in the polynomials of degree n.

In the step S103 of FIGS. 17 and 21, the case is shown in which, to obtain the initial illumination positions $PB_{kl}$ individually, the positions of the mark $M_0$ are detected by moving one mark $M_0$ shown in FIG. 3A. However, the positions of the plurality of marks $M_0$ to $M_8$ corresponding to the plurality of initial target positions $PA_{kl}$ and corresponding to the plurality of main target positions $PB_{mn}$, may be detected by moving the stage 26 only once, using the mark mount 25a on which the plurality of marks $M_0$ to $M_8$ are arranged as shown in FIG. 3B. The use of the plurality of marks $M_0$ to $M_8$ makes it possible to reduce the time required to move the stage 26. Here, it is sufficient that the deflection area F is divided into the plurality of initial blocks and into the plurality of main blocks in accordance with the spacing of the arranged marks $M_0$ to $M_8$, or that a mark mount is used which has a plurality of marks corresponding to intervals between the grid points of the initial blocks and the main blocks. In addition, in the step S107 of FIGS. 17 and 21 as well, the mark mount 25a, on which the plurality of marks $M_0$ to $M_8$ is arranged, may be used similarly.

In the procedures of steps S103 and S107 shown in FIGS. 17 and 21, there are some cases where an error occurs in the positional relationship between the plurality of marks when the plurality of marks is arranged in advance at the initial target positions $PA_{kl}$ and the main target positions $PB_{kl}$. In the case of occurring error, the correction coefficients $A_0$ to $A_9$ and $B_0$ to $B_9$ may be calculated by storing data concerning the error in the positional relationship in the main memory 7 or the like in advance; measuring the positional relationship between the marks may be measured; complementing (correcting) the error in the positional relationship between the marks. In addition, the number of the plurality of marks is not particularly limited. The stage 26 may be moved and measured in accordance with the number of the marks and the number of desired measurement points.

Each of the objective deflectors 22a and 22b may include a plurality of deflectors, such as a main deflector and a sub-deflector. Therefore, it may be possible to calculate correction values $(X_0, Y_0)$ equivalent to a deflection voltage to be applied to a deflector having a deflection distortion from among the plurality of deflectors. Alternatively, it may also be possible to calculate correction values $(X_0, Y_0)$ equivalent to a deflection voltage to be applied to a deflector without a deflection distortion different from the deflector having a deflection distortion. Moreover, it may also be possible to calculate correction values $(X_0, Y_0)$ equivalent to a deflection voltage to be applied to the plurality of deflectors.

What is claimed is:

1. A method of correcting deflection distortion comprising:
   dividing a deflection area to which a charged-particle beam is deflected into equal initial blocks as an initial setting;
   calculating an initial aberration amount for each of the initial blocks generated when the charged-particle beam is deflected;
   dividing the deflection area into main blocks in accordance with a change rate of the initial aberration amount;
   calculating a main aberration amount for each of the main blocks generated when the charged-particle beam is deflected; and
   calculating a correction value correcting a deflection distortion based on the main aberration amount.

2. The method of claim 1, wherein calculation of the initial aberration amount comprises:
   setting an initial target position defined inside the initial blocks for each of the initial blocks;
   obtaining an initial illumination position to which the charged-particle beam is deflected to the initial target positions; and
   calculating the initial aberration amount between the initial illumination position and the initial target position.

3. The method of claim 2, wherein obtainment of the initial illumination position comprises obtaining the initial illumination positions by actually deflecting the charged-particle beam to the initial target position.

4. The method of claim 2, wherein obtainment of the initial illumination position comprises obtaining the initial illumination positions by virtually deflecting the charged-particle beam to the initial target position.

5. The method of claim 1, wherein division of the deflection area comprising dividing the deflection area into the main blocks in order to change the size of the main blocks nonlinearly with respect to a distance from an optical axis when the initial aberration amount does not change proportional to the distance from the optical axis.

6. The method of claim 1, wherein division of the deflection area comprising dividing the deflection area into the main blocks in order to change the size of the main blocks linearly with respect to a distance from an optical axis when the initial aberration amount changes proportional to the distance from the optical axis.

7. The method of claim 1, wherein division of the deflection area comprising dividing first and second regions defined inside the deflection area having different change rates of the initial aberration amount into the main blocks, respectively, in accordance with a change rate of the initial aberration amount of the first and second regions respectively, when the deflection area includes the first and second regions.

8. The method of claim 1, wherein calculation of the main aberration amount comprises:
   setting a main target position defined inside the main blocks for each of the main blocks;
   obtaining a main illumination position to which the charged-particle beam is deflected to the main target positions; and
   calculating the main aberration amount between the main illumination position and the main target position.

9. The method of claim 8, wherein obtainment of the main illumination position comprises:
   placing marks on the main target positions respectively; and
   deflecting the charged-particle beam to the main target positions at which marks are placed.

10. The method of claim 8, wherein obtainment of the main illumination positions comprises
    placing a mark on the main target positions; and
    deflecting the charged-particle beam to the main target position at which the mark is placed.

11. The method of claim 1, wherein calculation of the correction value comprises:
calculating correction coefficients of a correction equation for calculating the correction value based on the main aberration amount; and
calculating the correction value using the correction coefficients.

12. The method of claim 11, wherein calculation of the correction coefficients comprised calculating a set of the correction coefficients for the deflection area.

13. The method of claim 11, wherein calculation of the correction coefficients comprises calculating sets of the correction coefficients for each of the main blocks.

14. The method of claim 13, wherein calculation of the correction value comprises calculating the correction value using the correction coefficients corresponding to the main block having the main illumination position.

15. A correction system comprising:
an initial division unit configured to divide a deflection area to which a charged-particle beam is deflected into equal initial blocks as an initial setting;
an initial aberration calculation unit configured to calculate an initial aberration amount for each of the initial blocks generated when the charged-particle beam is deflected;
a main division unit configured to divide the deflection area into main blocks in accordance with a change rate of the initial aberration amount;
a main aberration calculation unit configured to calculate a main aberration amount for each of the main blocks generated when the charged-particle beam is deflected; and
a correction unit configured to calculate a correction value correcting a deflection distortion based on the main aberration amount.

16. The correction system of claim 15, wherein the main division unit divides the deflection area into the main blocks in order to change the size of the main blocks nonlinearly with respect to a distance from an optical axis when the initial aberration amount does not change proportional to the distance from the optical axis.

17. The correction system of claim 15, wherein the main division unit divides the deflection area into the main blocks in order to change the size of the main blocks linearly with respect to a distance from an optical axis when the initial aberration amount changes proportional to the distance from the optical axis.

18. The correction system of claim 15, wherein the main division unit divides first and second regions defined inside the deflection area having different change rates of the initial aberration amount into the main blocks, respectively, in accordance with a change rate of the initial aberration amount of the first and second regions respectively, when the deflection area includes the first and second regions.

19. A program for executing an application on a correction system, the program comprising:
instructions for dividing a deflection area to which a charged-particle beam is deflected into initial blocks as an initial setting;
instructions for calculating an initial aberration amount for each of the initial blocks generated when the charged-particle beam is deflected;
instructions for dividing the deflection area into main blocks in accordance with a change rate of the initial aberration amount;
instructions for calculating a main aberration amount for each of the main blocks generated when the charged-particle beam is deflected; and
instructions for calculating a correction value correcting a deflection distortion based on the main aberration amount.

20. A method for manufacturing a semiconductor device comprising:
generating layout data of a device pattern for each layer of the semiconductor device corresponding to stages in a manufacturing process;
preparing a set of masks for each layers of the semiconductor device, each of masks dividing a deflection area to which a charged-particle beam is deflected into initial blocks as an initial setting, calculating an initial aberration amount for each of the initial blocks generated when the charged-particle beam is deflected, dividing the deflection area into main blocks in accordance with a change rate of the initial aberration amount, calculating a main aberration amount for each of the main blocks generated when the charged-particle beam is deflected, calculating a correction value correcting a deflection distortion based on the main aberration amount, and delineating masks corresponding to the stages, respectively, by deflecting the charged-particle beam using the correction value based on the layout data in a charged-particle beam drawing tool;
coating a resist film on a semiconductor wafer;
delineating an etching mask by exposing a device pattern of one of a mask in the set of masks to the resist film; and
processing the semiconductor wafer using the etching mask.

* * * * *